United States Patent
Fukuhara et al.

(10) Patent No.: US 8,384,229 B2
(45) Date of Patent: Feb. 26, 2013

(54) SEMICONDUCTOR DEVICE AND METHOD FOR MANUFACTURING THE SAME

(75) Inventors: Kazuya Fukuhara, Kanagawa (JP); Kiyonori Yoshitomi, Itami (JP); Takehiko Ikegami, Kanagawa (JP); Yujiro Kawasoe, Itami (JP)

(73) Assignee: Renesas Electronics Corporation, Kanagawa (JP)

( * ) Notice: Subject to any disclaimer, the term of this patent is extended or adjusted under 35 U.S.C. 154(b) by 188 days.

(21) Appl. No.: 12/913,332

(22) Filed: Oct. 27, 2010

(65) Prior Publication Data

US 2011/0101544 A1 May 5, 2011

(30) Foreign Application Priority Data

Nov. 5, 2009 (JP) ................................ 2009-253999

(51) Int. Cl.
  H01L 23/48 (2006.01)
  H01L 23/52 (2006.01)
  H01L 29/40 (2006.01)
(52) U.S. Cl. .................. 257/784; 257/773; 257/E23.06; 257/E23.07

(58) Field of Classification Search .............. 257/E23.06
See application file for complete search history.

(56) References Cited

U.S. PATENT DOCUMENTS

| 6,075,282 A * | 6/2000 | Champagne ................... 257/675 |
| 2009/0218683 A1* | 9/2009 | Satou et al. ................... 257/723 |
| 2010/0072604 A1* | 3/2010 | Komatsu et al. .............. 257/691 |

FOREIGN PATENT DOCUMENTS

JP 2007-165368 6/2007

* cited by examiner

*Primary Examiner* — Daniel Whalen
(74) *Attorney, Agent, or Firm* — McDermott Will & Emery LLP

(57) ABSTRACT

A semiconductor device permitting the reduction of cost is disclosed. In a semiconductor package wherein electrode pads of a semiconductor chip and corresponding inner leads are electrically coupled with each other through a plurality of bonding wires, sensing wires (second and fourth bonding wires) are made thinner than other bonding wires (first and third bonding wires) coupled to inner leads same as those with the sensing wires coupled thereto, thereby reducing the cost of gold wires to attain the reduction in cost of the semiconductor package.

14 Claims, 19 Drawing Sheets

| a | b | c | d | N | T |
|---|---|---|---|---|---|
| BONDING TIME | HEAT-UP WAIT | FEED TIME | RECOGNITION TIME | NUMBER OF FRAMES IN ONE CYCLE | REFERENCE TACT |
| (SEC/wire) | (SEC/Fr) | (SEC/Fr) | (SEC/Fr) | (SEC) | (SEC/NFr) |
| 0.1 | 5 | 14 | 21 | 60 | 3046 |
| 0.1 | 5 | 14 | 21 | 60 | 3046 |
| 0.1 | 5 | 14 | 21 | 60 | 3046 |

FIG. 21

| A | B | X | Y | C | T1 | D |
|---|---|---|---|---|---|---|
| 1st GROUP WIRES | 2nd GROUP WIRES | 1st GROUP W/B | 2nd GROUP W/B | CHIPS | TACT CALCULATION | TACT-DOWN RATE |
| (PIECE) | (PIECE) | (UNIT) | (UNIT) | (PIECE/Fr) | (PIECE/NFr) | (%) |
| 16 | 47 | 2 | 4 | 42 | 3561 | 14 |
| 16 | 47 | 1 | 5 | 42 | 6432 | 53 |
| 16 | 47 | 3 | 3 | 42 | 4748 | 36 |

FIG. 22

| A | B | X | Y | C | T1 | D |
|---|---|---|---|---|---|---|
| 1st GROUP WIRES | 2nd GROUP WIRES | 1st GROUP W/B | 2nd GROUP W/B | CHIPS | TACT CALCULATION | TACT-DOWN RATE |
| (PIECE) | (PIECE) | (UNIT) | (UNIT) | (PIECE/Fr) | (PIECE/NFr) | (%) |
| 21 | 42 | 2 | 4 | 42 | 3246 | 6 |
| 10 | 53 | 1 | 5 | 42 | 4920 | 38 |
| 31 | 32 | 3 | 3 | 42 | 3488 | 13 |

SEMICONDUCTOR DEVICE AND METHOD FOR MANUFACTURING THE SAME

The disclosure of Japanese Patent Application No. 2009-253999 filed on Nov. 5, 2009 including the specification, drawings and abstract is incorporated herein by reference in its entirety.

BACKGROUND OF THE INVENTION

The present invention relates to a semiconductor device and a method for manufacturing the same. Particularly, the present invention is concerned with a technique applicable effectively to the reduction in cost of a semiconductor device wherein plural wires are coupled to one and same lead electrically.

As an example of a semiconductor device wherein plural bonding wires are coupled to one and same lead electrically, there is disclosed in Japanese Unexamined Patent Publication No. 2007-165368 (Patent Document 1) a structure wherein three electrode pads of a semiconductor chip and one inner lead are coupled together through three bonding wires.

SUMMARY OF THE INVENTION

As an example of a power type semiconductor device there is known a semiconductor device which is mounted on a motor driver for an optical disk. In the present situation of a speed multiplying competition for increasing the rotational speed of a motor it is important for the semiconductor device to decrease the output ON resistance of a spindle motor.

This requirement can be satisfied by thickening gold wires to decrease the resistance value. But it is preferable that the other portion than the portion which requires thick gold wires be kept small in diameter for the reduction of cost. In the case of the semiconductor device in question, it is at least a power transistor portion in a motor driver that requires thick gold wirers. The other control portion does not require the use of gold wires.

In such a semiconductor device, plural gold wires are coupled for divided flow of an electric current to a lead for power supply or GND which lead assumes flowing therein of a large electric current. A sensing wire for overcurrent protection is also coupled to the lead and it is disposed adjacent the gold wires for power supply or GND. That is, plural gold wires are coupled to one and same lead for power supply or GND, one of those gold wires being a sensing wire.

The sensing wire senses a voltage drop of the wire itself, so if it comes into contact with another gold wire in the same lead, the amount of the voltage drop will change, thus resulting in loss of the sensing function. Therefore, in order to prevent the occurrence of wire shorting, gold wires of the same thickness are used as the gold wires coupled to the same lead so that the sensing wire deflects to the same degree as the gold wires for power supply or GND at the time of injection of sealing resin in a resin molding step.

Thus, since a gold wire of the same thickness as the gold wires for power supply or GND is used as the sensing wire, there exists the problem that the cost increases.

The technique described in Patent Document 1 (Japanese Unexamined Patent Publication No. 2007-165368) also refers to a structure wherein plural bonding wires are coupled to one and same inner lead electrically. However, the bonding wires are of the same in thickness and hence it is impossible to reduce the cost of the semiconductor device concerned.

The present invention has been accomplished in view of the above-mentioned problem and it is an object of the invention to provide a technique capable of reducing the cost of a semiconductor device.

It is another object of the present invention to provide a technique capable of improving the reliability of a semiconductor device.

It is a further object of the present invention to provide a technique capable of deriving wire bonding conditions at a suppressed tact-down rate in a method for manufacturing a semiconductor device having plural different types of wires.

The above and other objects and novel features of the present invention will become apparent from the following description and the accompanying drawings.

The following is a brief description of a typical invention out of the inventions disclosed herein.

A semiconductor device according to a typical mode of the present invention comprises a semiconductor chip having a plurality of electrode pads, a plurality of leads arranged around the semiconductor chip, a plurality of bonding wires for coupling the electrode pads and the leads electrically with each other, and a resinous sealing body for sealing the semiconductor chip, the bonding wires and a portion of the leads, the leads including a first power lead for supplying a first operating potential to the semiconductor chip, the electrode pads including a first power supply electrode pad coupled electrically to the first power lead through a first bonding wire and a first monitor electrode pad coupled electrically to the first power lead through a second bonding wire to monitor the potential of the first power lead, and the second bonding wire being thinner than the first bonding wire.

A method for manufacturing a semiconductor device according to another typical mode of the present invention comprises the steps of providing a lead frame having a chip mounting area and a plurality of leads arranged around the chip mounting area, mounting a semiconductor chip having a plurality of electrode pads onto the chip mounting area of the lead frame, coupling the leads and the electrode pads of the semiconductor chip electrically with each other through a plurality of bonding wires, and forming a resinous sealing body for sealing the semiconductor chip, the bonding wires and a portion of the leads, the bonding wires including a first bonding wire coupled at one end thereof to a first electrode pad out of the electrode pads and at an opposite end thereof to a first lead out of the leads and a second bonding wire coupled at one end thereof to a second electrode pad out of the electrode pads and at an opposite end thereof to the first lead and being thinner than the first bonding wire, and the second bonding wire being formed later than the first bonding wire.

A method for manufacturing a semiconductor device according to a further typical mode of the present invention is a method for manufacturing a semiconductor device assembled by bonding different types of bonding wires, comprising the steps of (a) providing a lead frame having a chip mounting area and a plurality of leads arranged around the chip mounting area, (b) mounting a semiconductor chip over the chip mounting area of the lead frame, (c) coupling a plurality of electrode pads of the semiconductor chip and the leads electrically with each other through the different types of bonding wires, wherein in the step (c) an optimum ratio of the number of bonding wires for each type and an optimum number of wire bonders for each type are derived using bonding conditions calculating means, the bonding condition calculating means functioning to calculate a distribution of the number of bonding wires for each type of bonding wires and a required number of wire bonders for each type of bonding wires, and wire bonding is performed under the thus-derived conditions.

The following is a brief description of effects obtained by the typical inventions out of the inventions disclosed herein.

By coupling bonding wires different in thickness to one and same lead it is possible to reduce the cost of the semiconductor device.

It is possible to diminish the occurrence of short-circuit and deformation of bonding wires of different thicknesses coupled to one and same lead and thereby improve the reliability of the semiconductor device.

BRIEF DESCRIPTION OF THE DRAWINGS

FIG. 21 is a calculated value data diagram showing an example of tact calculation for deriving wire bonding conditions used in the wire bonding step in assembling the semiconductor device of the second embodiment; and FIG. 22 is a calculated value data diagram showing an example of tact calculation taking into account a tact-down rate for deriving wire bonding conditions used in the wire bonding step in assembling the semiconductor device of the second embodiment.

DETAILED DESCRIPTION OF THE PREFERRED EMBODIMENTS

Figure 1:
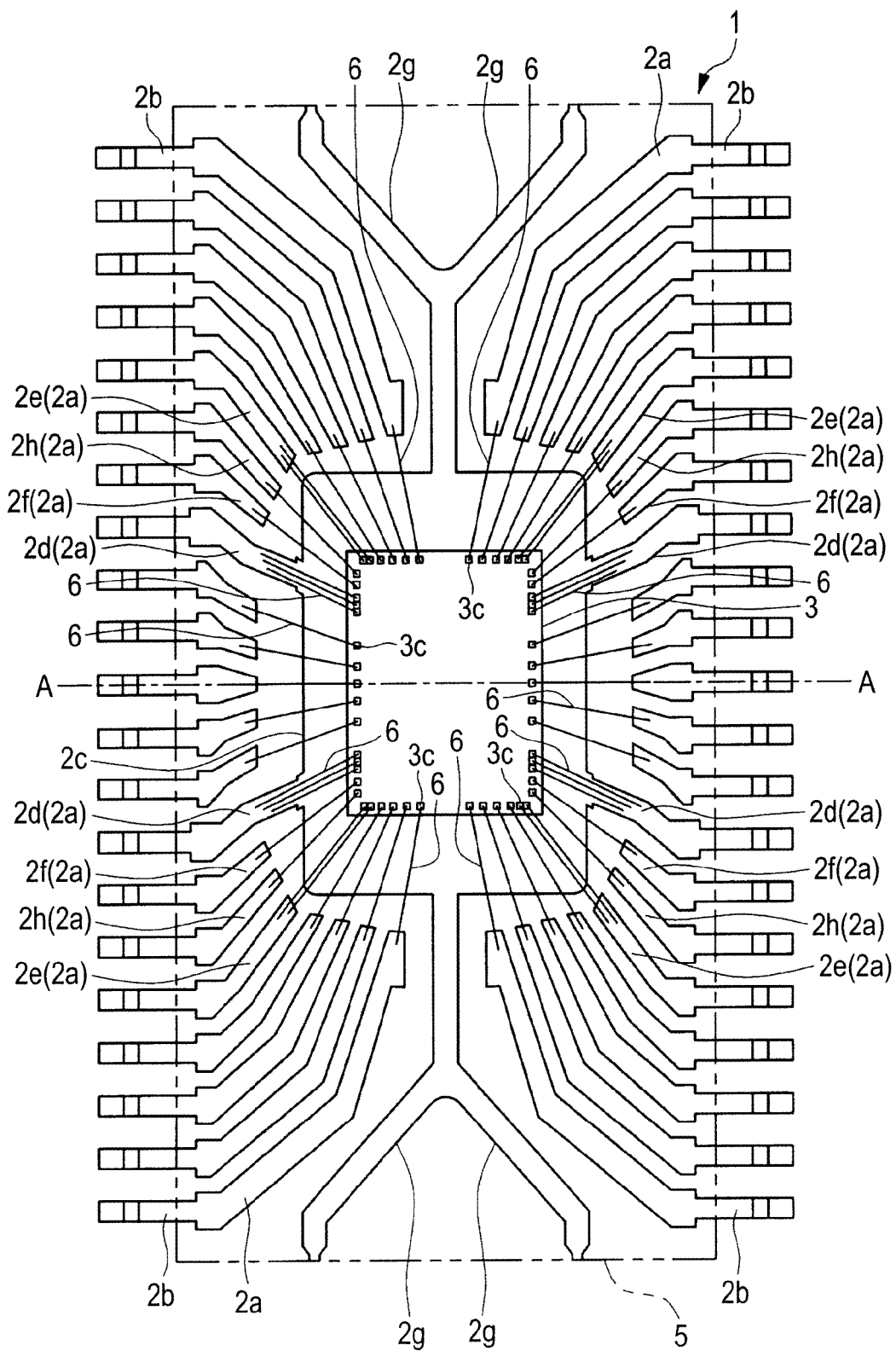
FIG. 1 is a partial plan view showing through a sealing body a structural example of a semiconductor device according to a first embodiment of the present invention.

In the following embodiments, explanations of the same or similar portions will not be repeated in principle except when specially required.

Where required for convenience's sake, the following embodiments will each be described in a divided manner into plural sections or embodiments, but unless otherwise mentioned, they are not unrelated to each other but are in a relation such that one is a modification or a detailed or supplementary explanation of part or the whole of the other.

In the following embodiments, when reference is made to the number of elements (including the number, numerical value, quantity and range), no limitation is made to the number referred to, but numerals above and below the number referred to will do as well unless otherwise mentioned and except the case where it is basically evident that limitation is made to the number referred to.

It goes without saying that in the following embodiments their constituent elements (including constituent steps) are not always essential unless otherwise mentioned and except the case where they are considered essential basically obviously.

Further, it goes without saying that in the following embodiments, "comprising A," "having A" and "including A" when described in connection with a constituent element or the like do not exclude other elements except the case where it is described clearly that limitation is made to only the element referred to. Likewise, it is to be understood that when reference is made to the shapes and a positional relation of constituent elements in the following embodiments, those substantially closely similar to or resembling such shapes, etc. are also included unless otherwise mentioned and except the case where a negative answer is evident basically. This is also true of the foregoing numerical value and range.

Embodiments of the present invention will be described below in detail with reference to the drawings. In all of the drawings for illustrating the drawings, members having the same functions are identified by the same reference numerals, and repeated explanations thereof will be omitted.

First Embodiment

Figure 2:
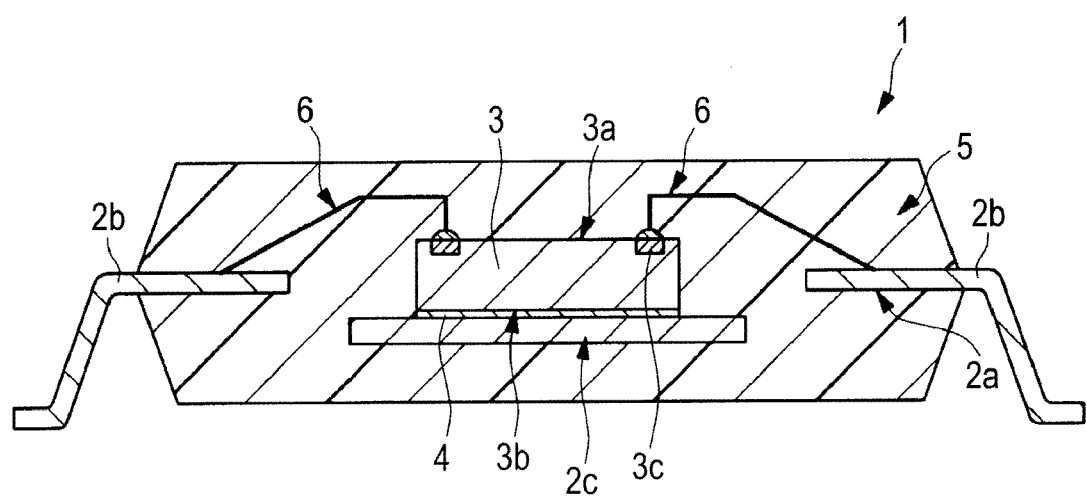
FIG. 2 is a partial sectional view showing an example of a structure taken along line A-A in FIG. 1.
Figure 3:
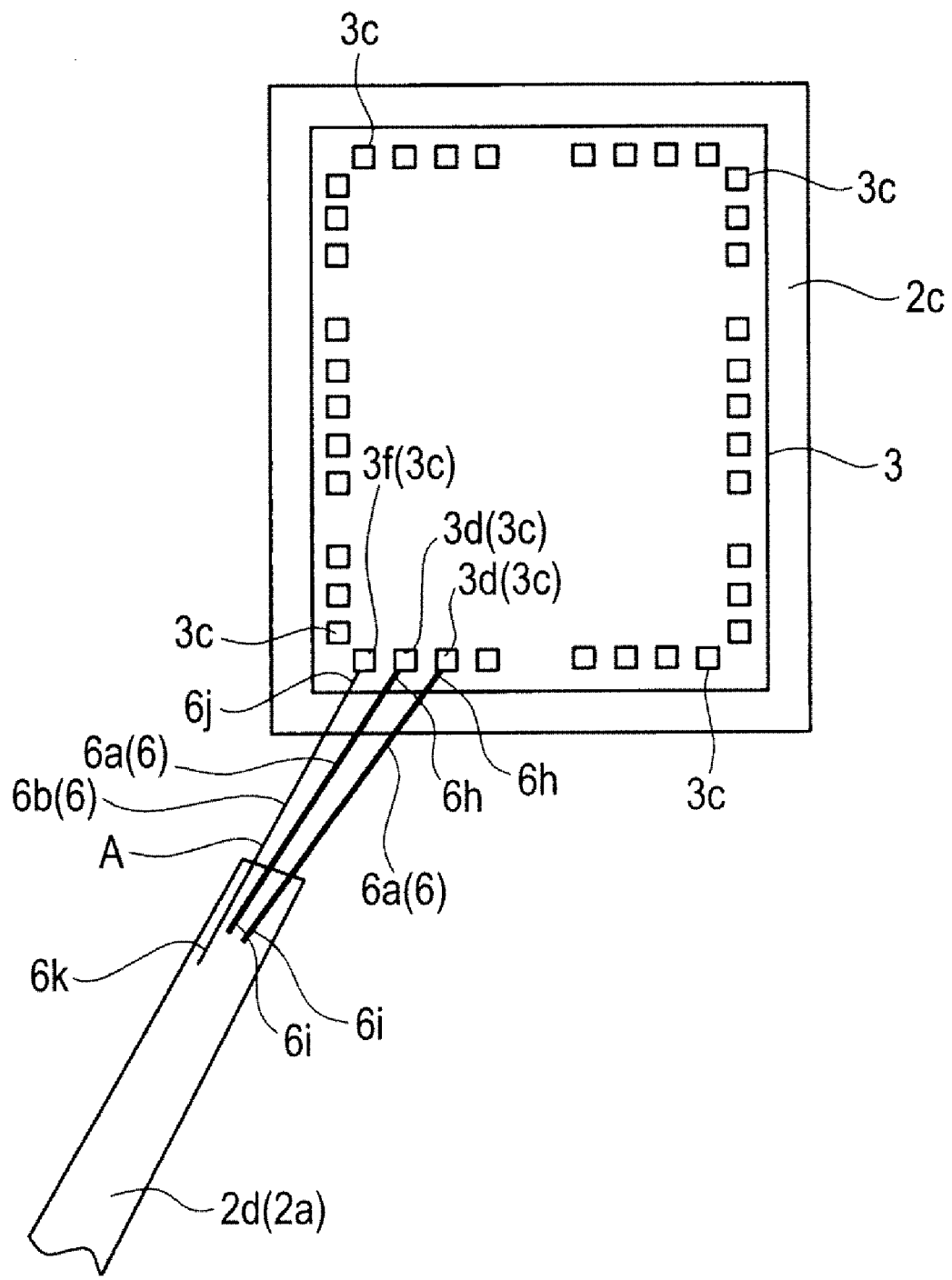
FIG. 3 is a partial plan view showing an example of a schematic structure of a characteristic portion of the semiconductor device shown in FIG. 1.
Figure 4:
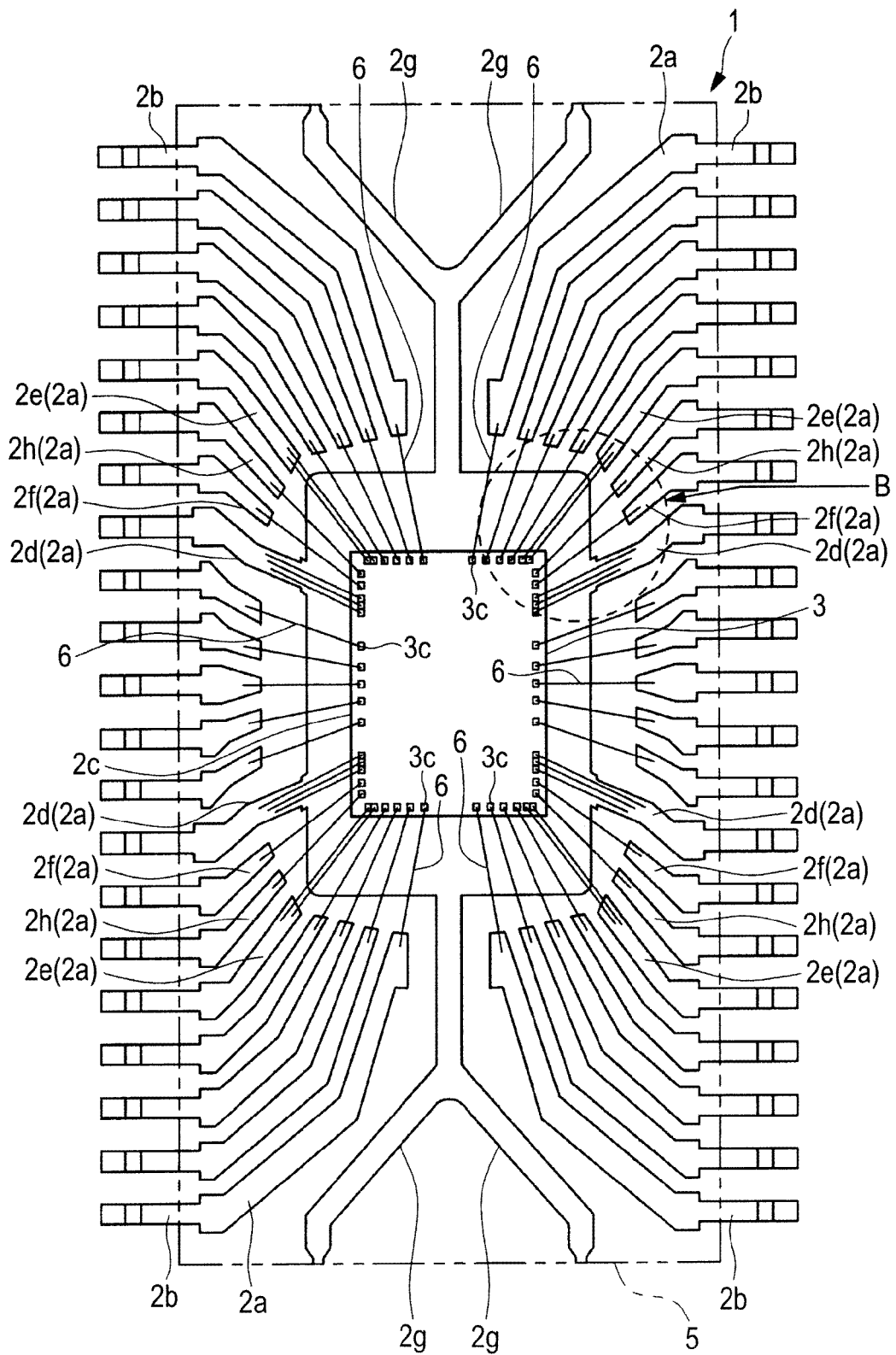
FIG. 4 is a plan view showing through the sealing body a structural example of the semiconductor device shown in FIG. 1.
Figure 5:
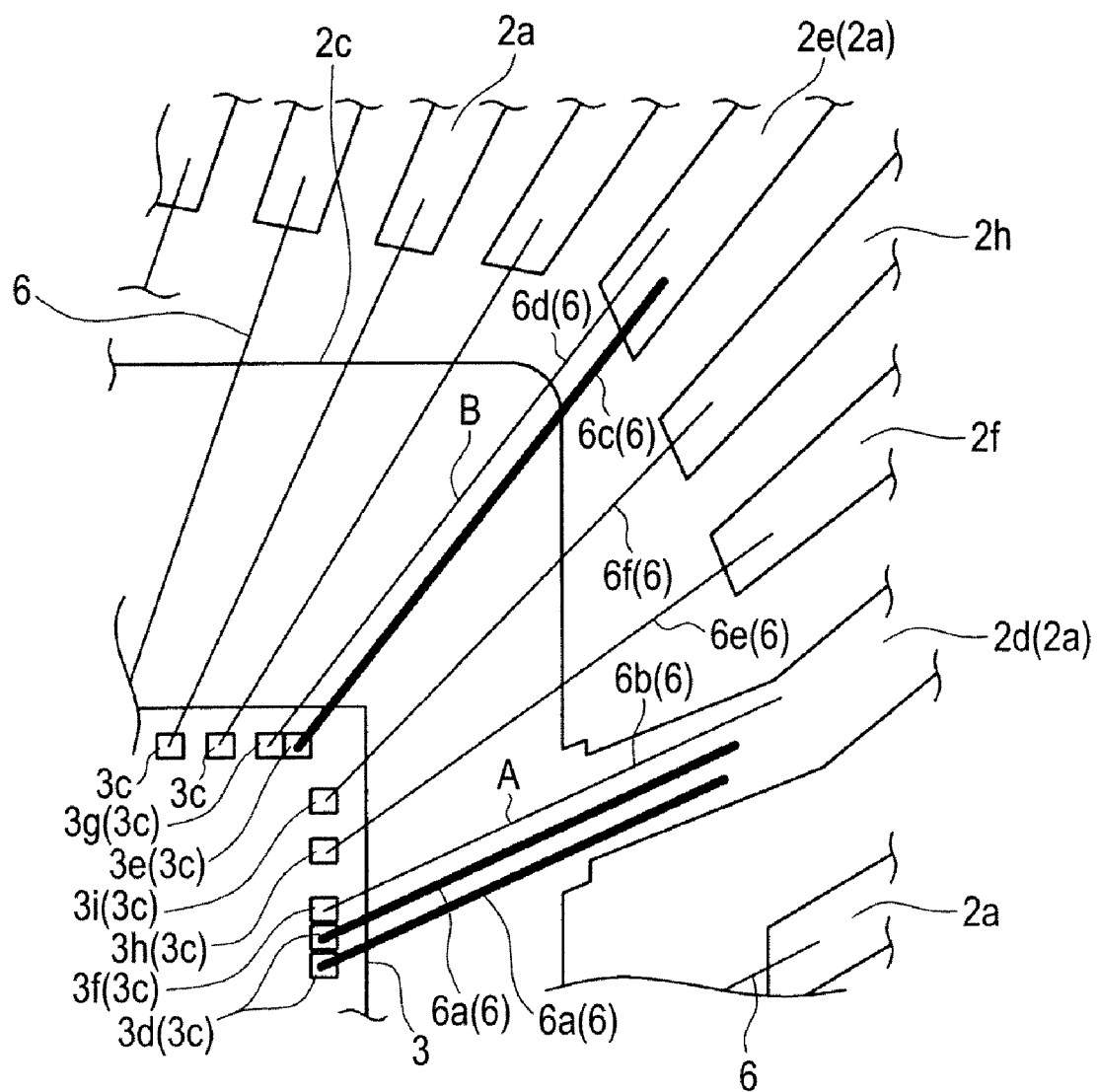
FIG. 5 is an enlarged partial plan view showing a structural example of a portion B shown in FIG. 4.
Figure 6:
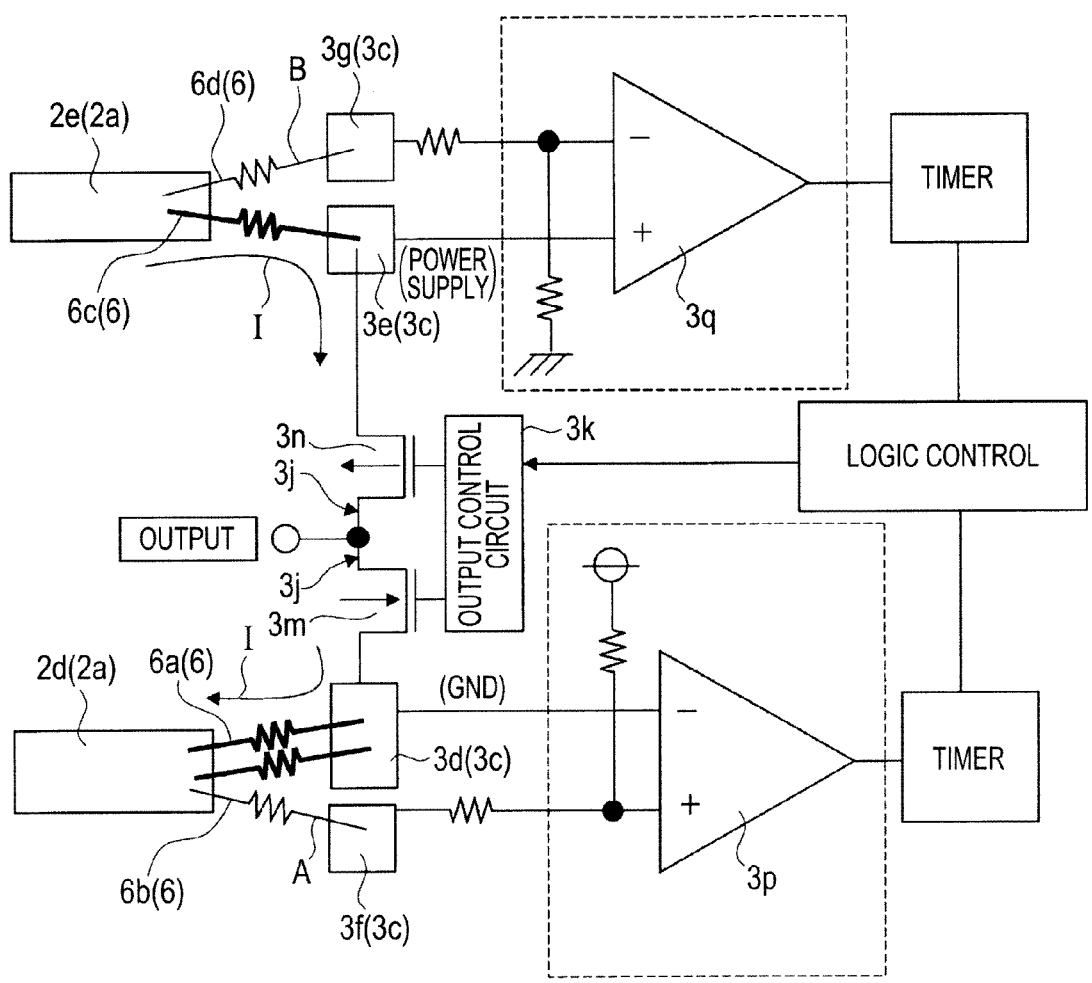
FIG. 6 is a circuit block diagram showing an example of an overcurrent protection circuit incorporated in the semiconductor device shown in FIG. 4.

FIG. 1 is a partial plan view showing through a sealing body a structural example of a semiconductor device according to a first embodiment of the present invention, FIG. 2 is a partial sectional view showing an example of a structure taken along line A-A in FIG. 1, and FIG. 3 is a partial plan view showing an example of a schematic structure of a characteristic portion of the semiconductor device shown in FIG. 1. Further, FIG. 4 is a plan view showing through the sealing body a structural example of the semiconductor device shown in FIG. 1, FIG. 5 is an enlarged partial plan view showing a structural example of a portion B shown in FIG. 4, and FIG. 6 is a circuit block diagram showing an example of an overcurrent protection circuit incorporated in the semiconductor device shown in FIG. 4.

The semiconductor device of this first embodiment is a resin sealing type semiconductor package 1 which is assembled using a lead frame and wherein wire bonding is performed for electrical coupling between a semiconductor chip and leads.

The above semiconductor device of this first embodiment is, for example, an SOP (Small Outline Package), provided no limitation is made to the SOP. In this first embodiment, as an example of the semiconductor package 1, reference will be made to a power type semiconductor package 1 to be mounted on a motor driver for an optical disk. However, the semiconductor package 1 may be a semiconductor device which is mounted on a power type device other than the motor driver for an optical disk or may be a semiconductor device which is mounted on a device other than power devices.

As to the motor for an optical disk, a keen speed multiplexing competition for increasing the rotational speed of the motor is in progress. In connection with a wire for coupling an electrode pad 3c of a semiconductor chip 3 and an inner lead 2a electrically with each other, there sometimes is a case where a large electric current flow is assumed and there is adopted a technique of coupling a plurality of wires to one and same inner lead 2a so that the electric current flows in a divided manner. Also in the semiconductor package 1 of this first embodiment there is adopted a technique of coupling a plurality of bonding wires to a lead for power supply or GND, assuming the flow of a large electric current. In this case, a sensing wire for overcurrent protection is also coupled to a part of the lead with plural bonding wires coupled thereto. This sensing wire is disposed adjacent a bonding wire for power supply or GND. That is, plural bonding wires are coupled to one and same lead for power supply or GND and one of them is a sensing wire, which has a function of sensing a voltage drop of the wire itself.

Next, with reference to FIGS. 1 to 6, a description will be given about the structure of the semiconductor package 1 according to this first embodiment. The semiconductor package 1 includes a semiconductor chip 3 having a main surface 3a and plural electrode pads 3c formed on the main surface 3a, plural inner leads (leads) 2a arranged around the semiconductor chip 3, plural bonding wires 6 for coupling the electrode pads 3c and the inner leads 2a electrically with each other, a resinous sealing body 5 for sealing the semiconductor chip 3, bonding wires 6 and a portion (inner leads 2a) of the leads, and plural outer leads 2b formed integrally with the inner leads 2a and projecting outwards from the resinous sealing body 5.

As shown in FIGS. 1 and 2, the semiconductor chip 3 is mounted onto a die pad 2c as a chip mounting area through a die bonding material 4. In this case, the semiconductor chip 3 is face-up-mounted onto the die pad 2c so that its main surface 3a faces upwards. Thus, a back surface 3b of the semiconductor chip 3 and the die pad 2c are coupled together through the die bonding material 4. The die bonding material 4 is, for example, paste resin containing silver filler. The semiconductor chip 3 is formed with a semiconductor integrated circuit in the interior thereof and the plural electrode pads 3c are formed side by side at a peripheral edge portion of the main surface 3a.

The die pad 2c is generally quadrangular like the semiconductor chip 3 and is embedded in the interior of the resinous sealing body 5. Further, as shown in FIG. 1, the die pad 2c is supported by suspending leads 2g which are integral with central portions of two opposed sides of the die pad. That is, in the semiconductor package 1 of this first embodiment, the die pad 2c is supported by two suspending leads 2g disposed in opposition to each other.

As shown in FIG. 1, each suspending lead 2g is bifurcated at a position between the die pad 2c and an outer periphery portion of the resinous sealing body 5, the two branched lead portions terminating at the outer periphery portion of the sealing body 5.

Since the semiconductor package 1 of this first embodiment shown in FIG. 1 images SOP, plural outer leads 2b project from two opposed sides located in the longitudinal direction of the resinous sealing body 5. More specifically, in each of opposed both-side areas partitioned by one and the other suspending leads 2g and the die pad 2c, plural inner leads 2a are arranged radially around the semiconductor chip 3 and the die pad 2c.

Since the semiconductor package 1 is a power type of a large power consumption, the die pad 2c is set at a supply (or GND) potential in order to stabilize the power supply (or GND). In this connection, four inner leads 2a are formed of the same material as the die pad 2c and are integral and continuous with the die pad. These four inner leads 2a are further coupled to outer leads 2a respectively and are projected as external terminals to the exterior of the resinous sealing body 5.

For example, in the case of setting the die pad 2c at the power supply potential, electrode pads 3c for power supply of the semiconductor chip 3 and the four inner leads 2a (power leads) are coupled together electrically through plural bonding wires for power supply (such wire bonding is also called down bonding). Consequently, the four inner leads 2a coupled integrally with the die pad 2c, as well as the outer leads 2b, also assume the power supply potential and are exposed as power leads to the exterior from the resinous sealing body 5.

As a result, the die pad 2c assumes the power supply potential over a wide area, thus making it possible to attain the stabilization of the power supply (in the case of the die pad 2c being at the GND potential, it is possible to attain the stabilization of GND).

The inner leads 2a, outer leads 2b, die pad 2c and suspending leads 2g are each formed, for example, by a thin plate member such as a thin copper alloy plate. The resinous sealing body 5 is formed of, for example, a thermosetting epoxy resin and it is formed by resin molding in accordance with a transfer molding method which uses a molding die 8 having a resin injection gate 8d shown in FIG. 14 as will be described later.

In some inner leads 2a of the semiconductor package 1 of this first embodiment, as shown in FIGS. 1 and 3, the plural bonding wires 6 are bonded to one and same inner leads 2a. Bonding wires 6 (all the bonding wires 6 in the semiconductor package 1, including first bonding wires 6a, second bonding wires 6b, third bonding wires 6c, fourth bonding wires 6d and fifth bonding wires 6e, 6f) are, for example, gold wires.

As shown in FIGS. 4 and 5, for example three bonding wires 6 are coupled electrically to each of four inner leads 2a which are integrally coupled to the die pad 2c, and for example two bonding wires 6 are coupled electrically to each of electrically corresponding inner leads 2a (corresponding in power supply—GND relation).

FIG. 5 shows the details of a wired state in the case where the die pad 2c is set at GND potential (ground potential) in the semiconductor package 1.

Therefore, leads (first power leads) 2d for GND as four inner leads 2a coupled integrally to the die pad 2c are coupled electrically to electrode pads (first electrode pads for power supply) 3d of the semiconductor chip 3.

On the other hand, of the individual inner leads 2a separated from the die pad 2c, power leads (second power leads) 2e are coupled electrically to electrode pads for power supply (second electrode pads for power supply) of the semiconductor chip 3.

The leads 2d for GND are for supplying the semiconductor chip 3 with the GND potential (ground potential) which is the first operating potential. The leads 2d for GND are each coupled electrically to an electrode pad 3d for GND of the semiconductor chip 3 through a first bonding wire 6a. In an electrode pad 3c of the semiconductor chip 3 is provided an electrode pad for GND monitor (a first electrode pad for monitor) 3f adjacent the electrode pad 3d for GND to monitor the potential of the lead 2d for GND. The electrode pad 3f for GND monitor and the lead 2d for GND are coupled together electrically through a second bonding wire 6b which is thinner than the first bonding wire 6a. The thin second bonding wire 6b is a sensing wire A, which monitors the potential of the lead 2d for GND. More specifically, the sensing wire A monitors a voltage drop between the lead 2d for GND and the electrode pad 3f for GND monitor.

In the example shown in FIG. 5, three electrode pads 3c (3d, 3f) of the semiconductor chip 3 and one lead 2d for GND are coupled together electrically through three bonding wires 6 (two first bonding wires 6a and one second bonding wire 6b). That is, two thick first bonding wires 6a and one thin second bonding wire 6b (sensing wire A) are coupled electrically to one and same lead 2d for GND.

The diameter of each thick first bonding wire 6a is, say, 30 μm or so and that of the thin second bonding wire 6b is, say, 23 μm or so.

On the other hand, the leads 2e for power supply are for supplying the semiconductor chip 3 with a power supply potential which is a second operating potential higher than the first operating potential (ground potential). The leads 2e for power supply are each coupled electrically to an electrode pad 3e for power supply of the semiconductor chip 3 through a third bonding wire 6c. In an electrode pad 3c of the semiconductor chip 3 is provided an electrode pad for power supply monitor (a second electrode pad for monitor) 3g adjacent the electrode pad 3e for power supply to monitor the potential of the lead 2e for power supply. The electrode pad 3g for power supply monitor and the lead 2e for power supply are coupled together electrically through a fourth bonding wire 6d which is thinner than the third bonding wire 6c. The thin fourth bonding wire 6d is a sensing wire B, which monitors the potential of the lead 2e for power supply. More specifically, the sensing wire B monitors a voltage drop between the lead 2e for power supply and the electrode pad 3g for power supply monitor.

In the example shown in FIG. 5, two electrode pads 3c (3e, 3g) of the semiconductor chip 3 and one lead 2e for power supply are coupled together electrically through two bonding wires 6 (one third bonding wire 6c and one fourth bonding wire 6d). That is, one thick third bonding wire 6c and one thin fourth bonding wire 6d (sensing wire B) are coupled electrically to one and same lade 2e for power supply.

As in the previous case, the diameter of the thick third bonding wire 6c is, say, 30 μm or so and that of the thin fourth bonding wire 6d is, say, 23 μm or so.

In electrode pads 3c of the semiconductor chip 3 are provided a first output signal pad 3h and a second output signal pad 3i both for output and a first output signal pad 3h for GND is coupled electrically to a first output lead 2f for GND through a fifth bonding wire 6e. On the other hand, a second output signal 3i for power supply is coupled electrically to a second output lead 2h for power supply through a fifth bonding wire 6f. The fifth bonding wires 6e, 6f are thin wires 23 μm or so in diameter like the second bonding wire 6b and the fourth bonding wire 6d.

In the semiconductor package 1 there are a large number of inner leads 2a to each of which only one gold wire is coupled electrically, like the first and second output leads 2f, 2h. In this case, the bonding wires 6 coupled respectively to the inner leads 2a to each of which is coupled only one gold wire are thin gold wires having a diameter of, say, 23 μm or so. That is, in the semiconductor package 1 of this first embodiment shown in FIG. 4, out of two or three bonding wires 6 coupled electrically to one and same inner lead 2a, one or two are thick gold wires each 30 μm or so in diameter.

That is, as shown in FIG. 5, one of two bonding wires 6 coupled to one and same inner lead 2a, or two of three bonding wires 6 coupled to one and same inner lead 2a, is (are) a thick gold wire(s) about 30 μm in diameter for GND or for power supply. All the other wires, including the sensing wires A and B, are thin gold wires about 23 μm in diameter. Thus, in the case of one and same inner lead 2a with two or three gold wires coupled thereto, a thick gold wire for GND or for power supply and a thin sensing gold wire are mixedly coupled thereto.

The following description is now provided about an overcurrent protection circuit shown in FIG. 6 which circuit is incorporated in the semiconductor chip 3.

The overcurrent protection circuit includes an output circuit 3j for outputting an electric current to drive an external device as a load and an output control circuit 3k as a control circuit for controlling the electric current.

The output circuit 3j operates at a ground potential (first operating potential) and a power supply potential (second operating potential) which are supplied from an electrode pad for GND (first electrode pad for power supply) 3d and an electrode pad for power supply (second electrode pad for power supply) 3e, respectively.

The output control circuit 3k controls the output of the output circuit 3j in accordance with predetermined signals provided from an electrode pad 3f for GND monitor and an electrode pad 3g for power supply monitor, respectively.

In the overcurrent protection circuit, the electrode pad 3d for GND and the electrode pad 3f for GND monitor are coupled to a first comparator 3p electrically, and the electrode pad 3d for GND coupled electrically to the lead 2d for GND through two thick first bonding wires 6a is coupled electrically to a first output transistor 3m in the output circuit 3j. Further, the electrode pad 3f for GND monitor is coupled electrically to the lead 2d for GND through a thin second bonding wire (sensing wire A) 6b.

According to this construction, the second bonding wire 6b as the sensing wire A monitors the electric current flowing in the thick first bonding wires 6a, and when an overcurrent is detected by the first comparator 3p, the first output transistor 3m is turned OFF. That is, the result detected by the first comparator 3p is fed back to the first output transistor 3m (to turn the first output transistor 3m ON or OFF) through the output control circuit 3k. In the first comparator 3p, a converted voltage value is monitored because it is impossible to monitor an electric current value directly.

On the other hand, the electrode pad 3e for power supply and the electrode pad 3g for power supply monitor are coupled to a second comparator 3q electrically, and the electrode pad 3e for power supply coupled to the lead 2e for power supply through one thick third bonding wire 6c is coupled electrically to a second output transistor 3n in the output circuit 3j. The electrode pad 3g for power supply monitor is coupled to the lead 2e for power supply electrically through a thin fourth bonding wire (sensing wire B) 6d.

According to this construction, the fourth bonding wire 6d as the sensing wire B monitors the electric current flowing in the thick third bonding wire 6c, and when an overcurrent is detected by the second comparator 3q, the second output transistor 3n is turned OFF. That is, the result detected by the second comparator 3q is fed back to the second output transistor 3n (to turn the second output transistor 3n ON or OFF) through the output control circuit 3k. Also in the second comparator 3q, a converted voltage value is monitored because it is impossible to monitor an electric current value directly.

In the electrode pads 3c of the semiconductor chip 3 are included first and second output signal pads 3h, 3i as shown in FIG. 5, both being output signal pads used as output terminals of the output circuit 3j. The first output signal pad 3h for GND is coupled electrically to the first output lead 2f for GND through the fifth bonding wire 6e, while the second output signal pad 3i for power supply is coupled electrically to the second output lead 2h for power supply through the fifth bonding wire 6f.

When an overcurrent in the first bonding wire 6a for GND or in the third bonding wire 6c for power supply is detected, it is possible to stop output by operating the protection circuit immediately.

Thus, in the semiconductor package 1 of this first embodiment, by making the sensing wires A and B (the second and fourth bonding wires 6b, 6d) thinner than the other bonding wires 6 (the first and third bonding wires 6a, 6c) coupled to one and same inner lead 2a, it is possible to reduce the cost of gold wires and thereby attain the reduction in cost of the semiconductor package 1.

In the semiconductor package 1 of this first embodiment there are used gold wires as the bonding wires 6, so that thinning the bonding wires 6 is very effective in reducing the cost of the semiconductor package 1.

Next, a method for manufacturing the semiconductor package 1 according to this first embodiment will be described below with reference to a manufacturing flow chart of FIG. 7.

Figure 7:
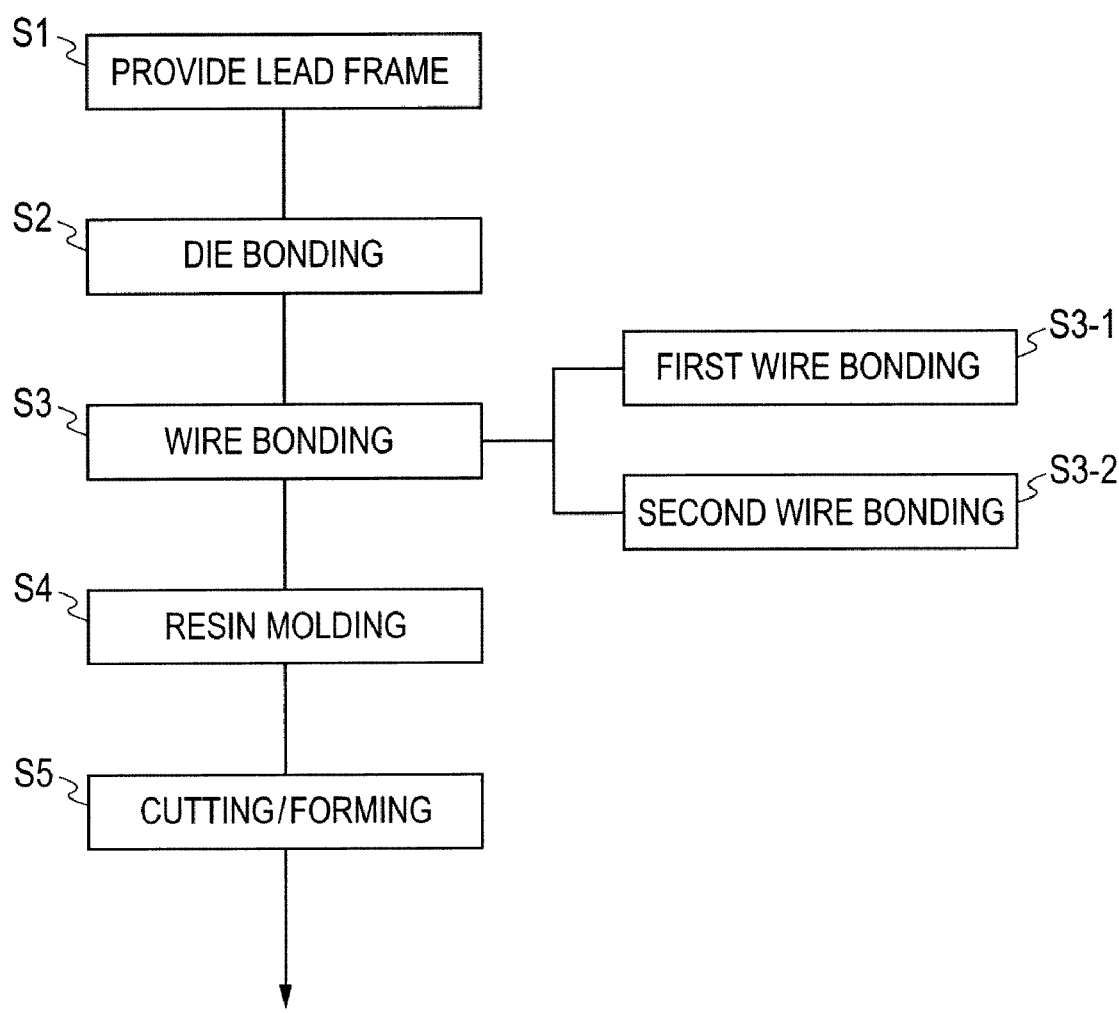
FIG. 7 is a manufacturing flow chart showing an example of an assembling procedure for the semiconductor device shown in FIG. 1.
Figure 8:
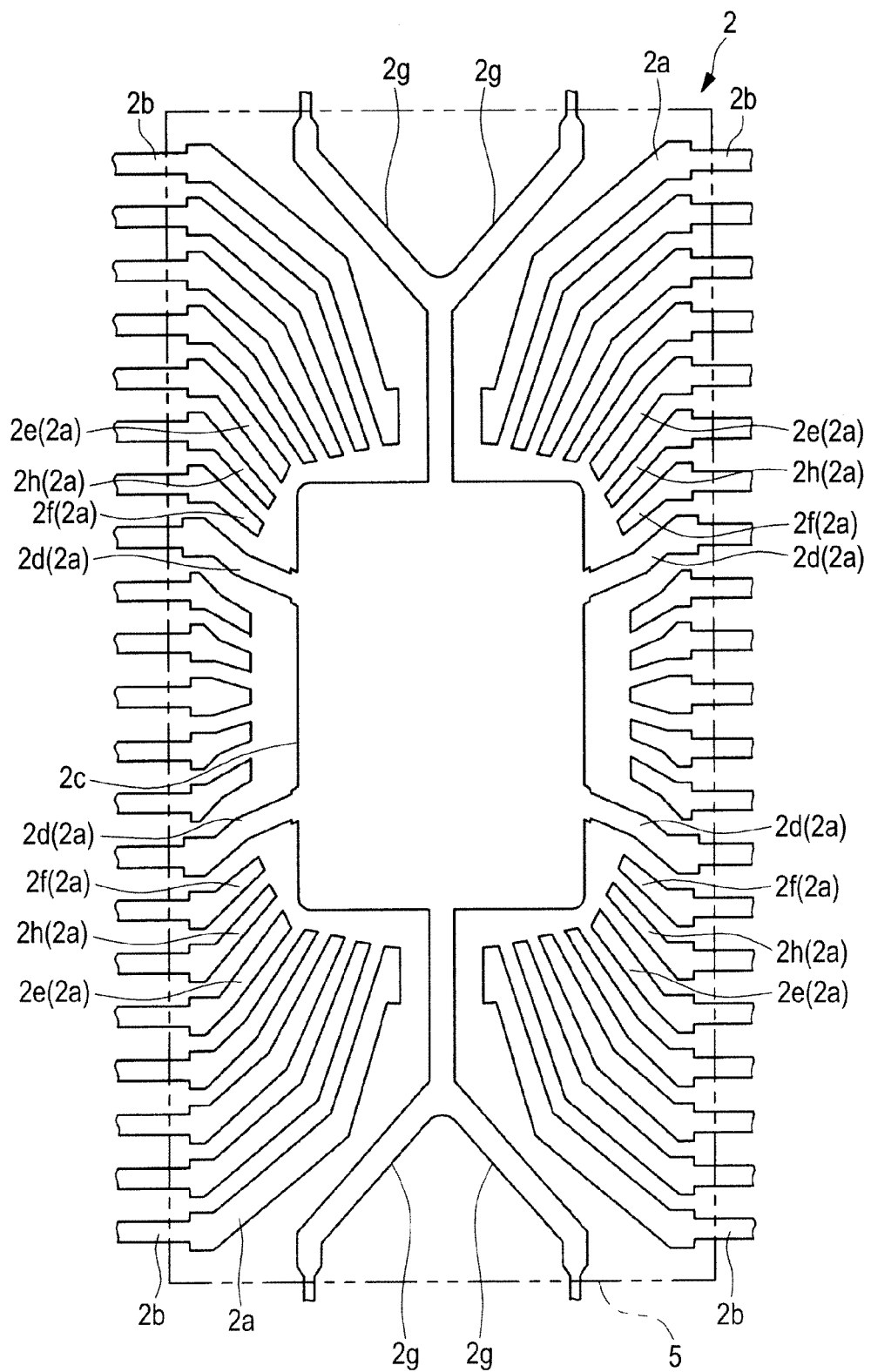
FIG. 8 is a partial plan view showing a structural example of a lead frame used in assembling the semiconductor device shown in FIG. 1.
Figure 9:
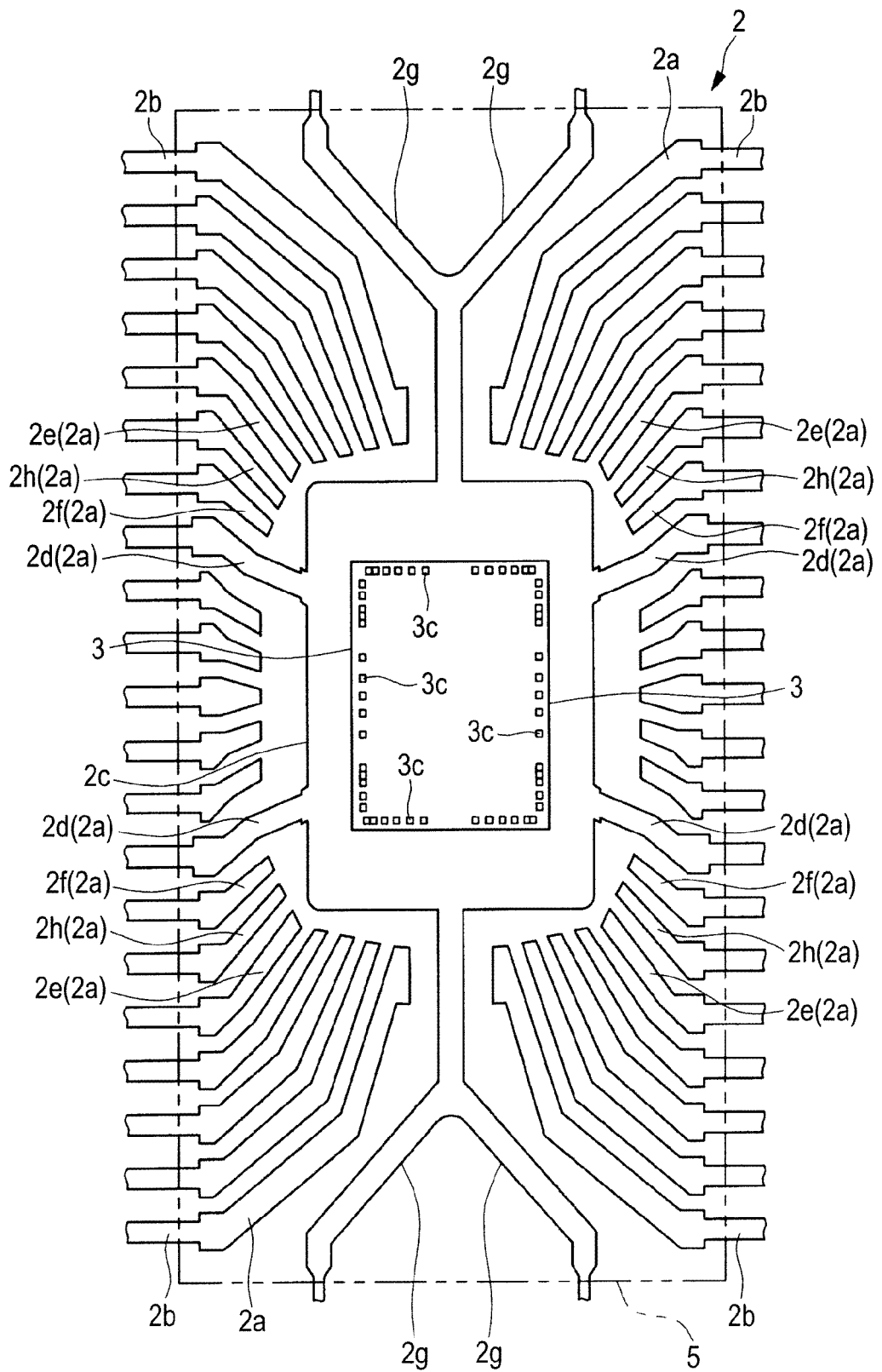
FIG. 9 is a partial plan view showing a structural example after die bonding in assembling the semiconductor device shown in FIG. 1.
Figure 10:
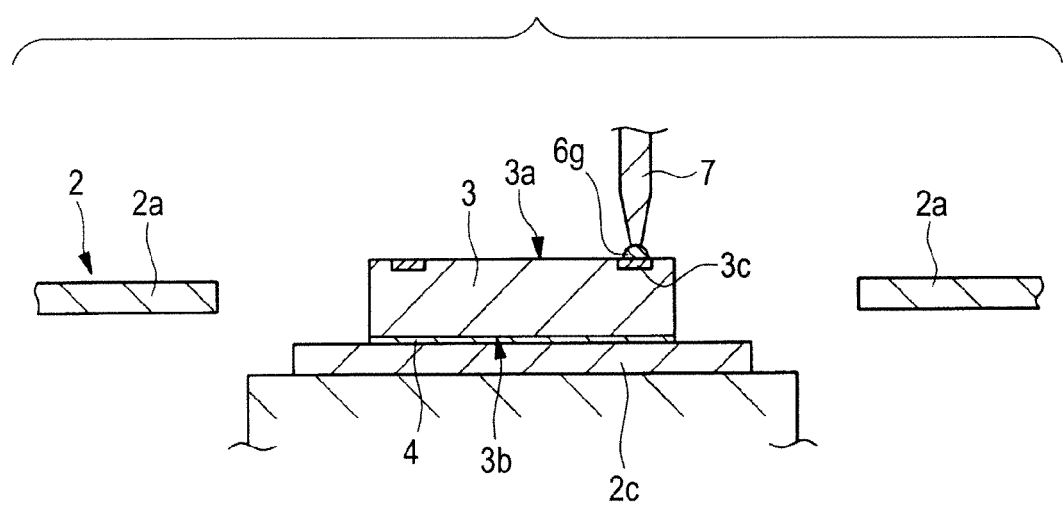
FIG. 10 is a partial sectional view showing an example of a ball bonding method in a wire bonding step in assembling the semiconductor device shown in FIG. 1.
Figure 11:
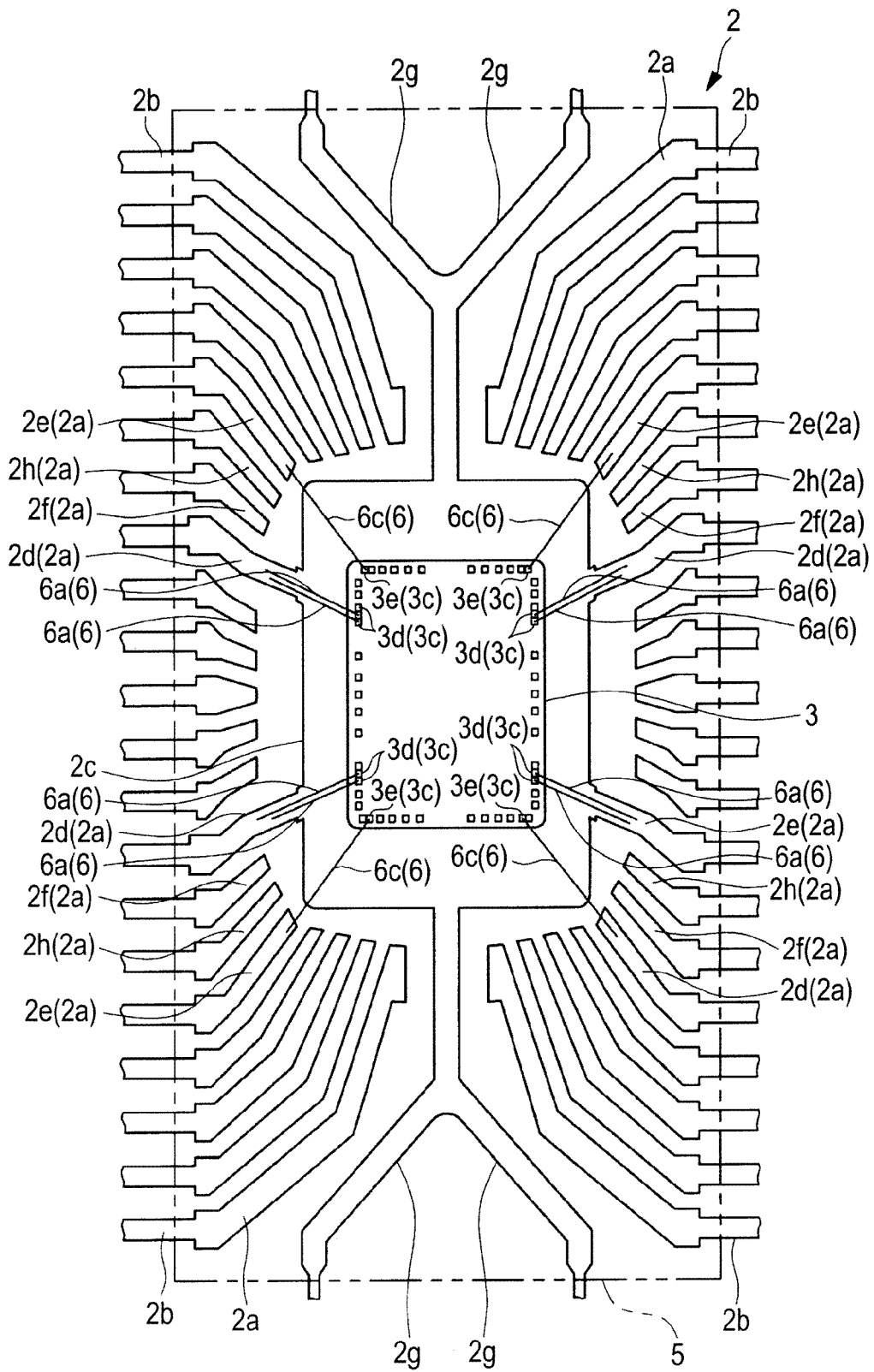
FIG. 11 is a partial plan view showing a structural example after first wire bonding in assembling the semiconductor device shown in FIG. 1.
Figure 12:
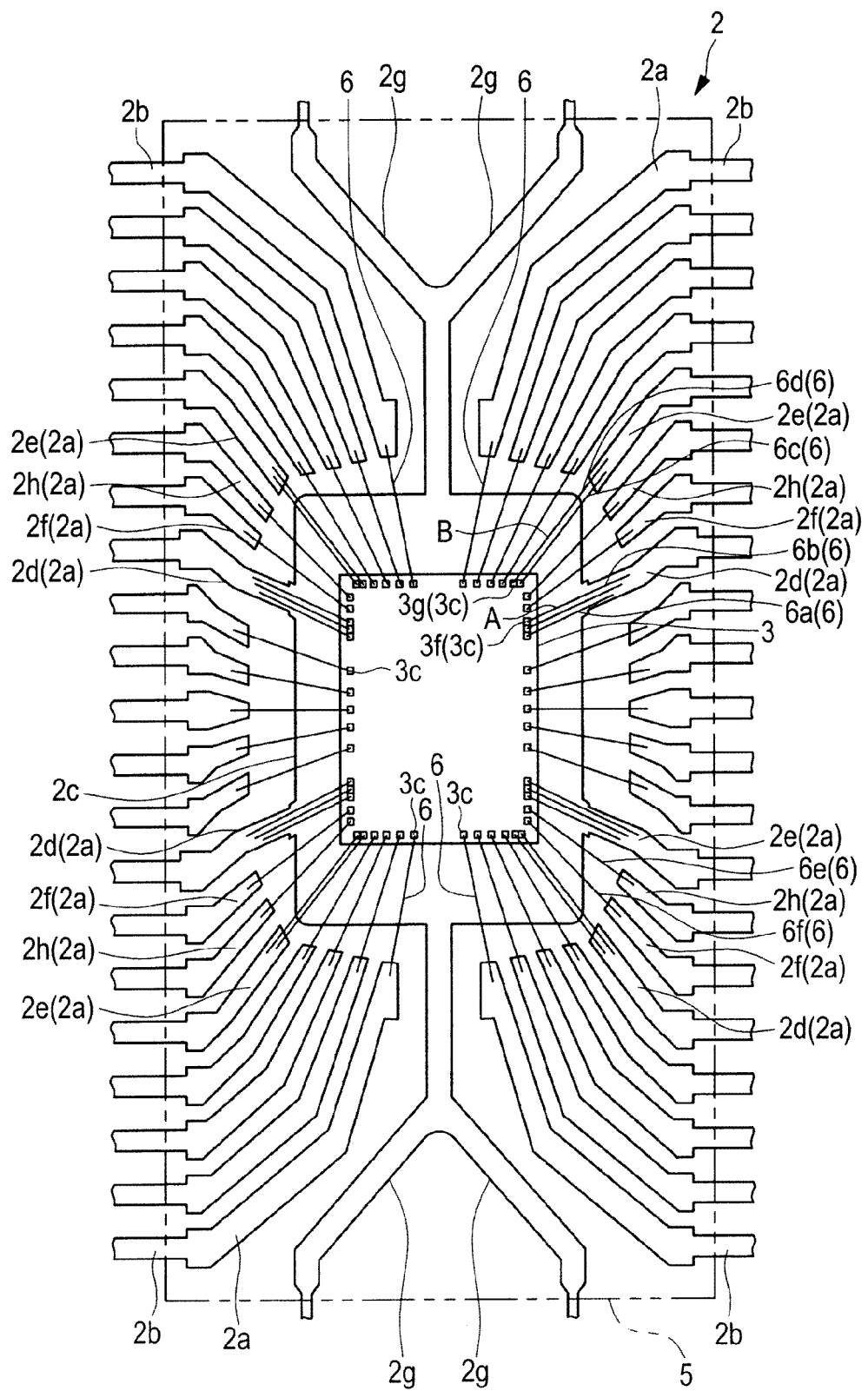
FIG. 12 is a partial plan view showing a structural example after second wire bonding in assembling the semiconductor device shown in FIG. 1.
Figure 13:
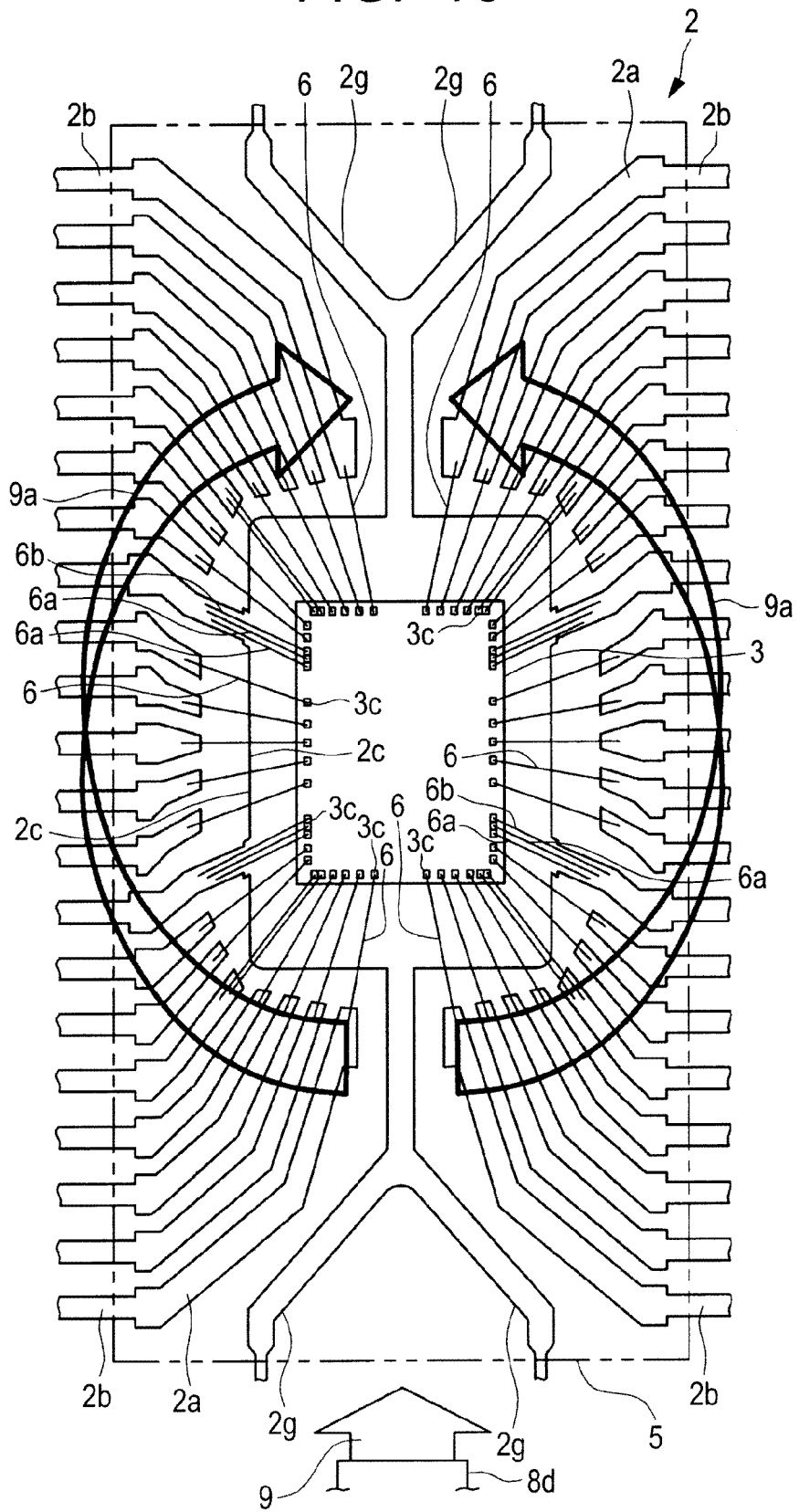
FIG. 13 is a plan view showing an example of resin flowing directions during the injection of resin in a resin molding step in assembling the semiconductor device shown in FIG. 1.
Figure 14:
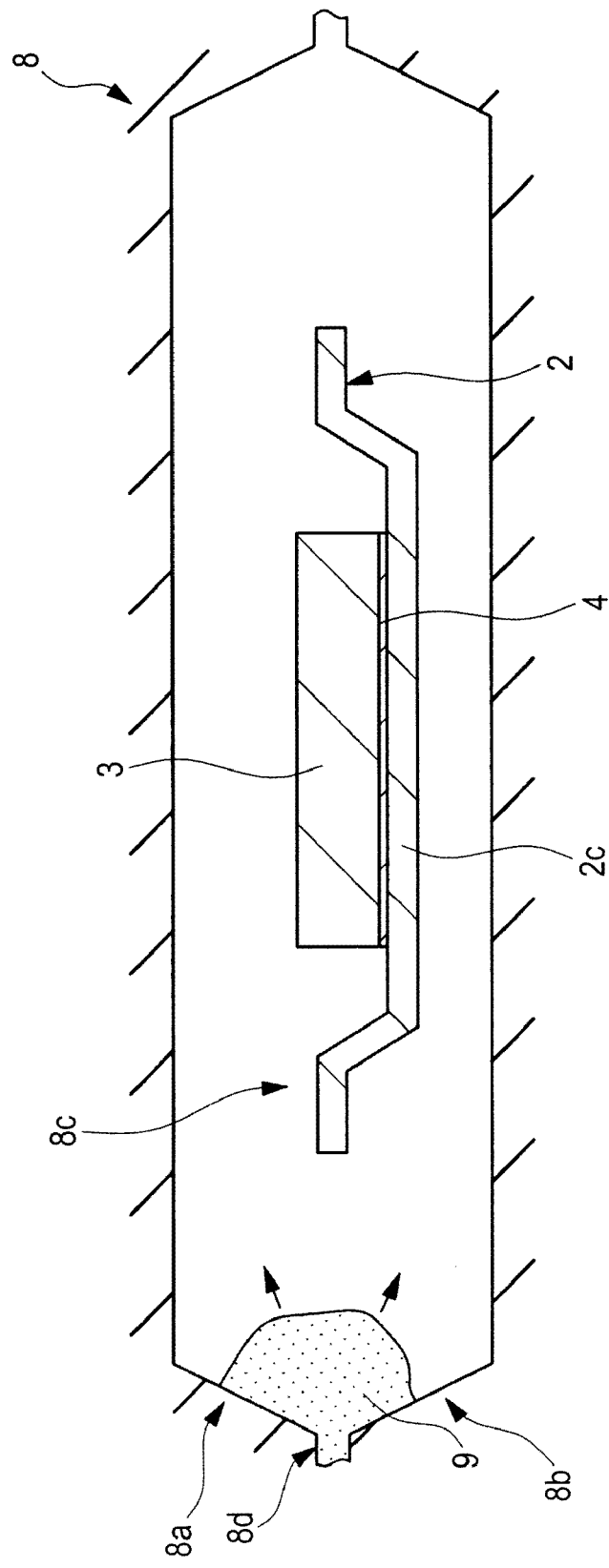
FIG. 14 is a partial sectional view showing a structural example in the interior of a cavity of a molding die during the resin injection shown in FIG. 13.
Figure 15:
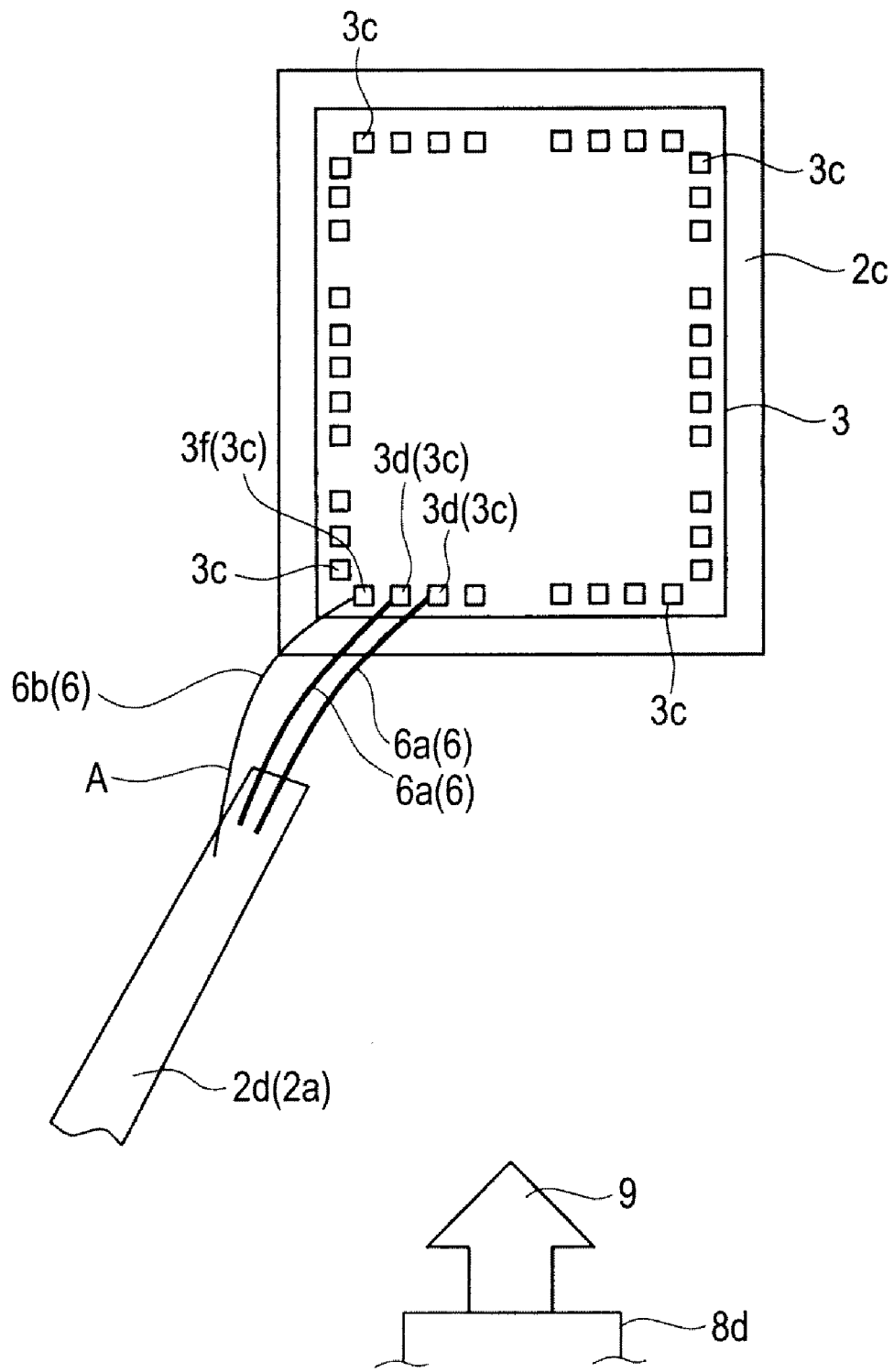
FIG. 15 is a partial plan view showing an example of a positional relation between a resin injection gate of the molding die and a sensing wire during the injection of resin shown in FIG. 13.

FIG. 7 is a manufacturing flow chart showing an example of an assembling procedure for the semiconductor device shown in FIG. 1, FIG. 8 is a partial plan view showing a structural example of a lead frame used in assembling the semiconductor device shown in FIG. 1, and FIG. 9 is a partial plan view showing a structural example after die bonding in assembling the semiconductor device shown in FIG. 1. FIG. 10 is a partial sectional view showing an example of a ball bonding method in a wire bonding step in assembling the semiconductor device shown in FIG. 1, FIG. 11 is a partial plan view showing a structural example after first wire bonding in assembling the semiconductor device shown in FIG. 1, and FIG. 12 is a partial plan view showing a structural example after second wire bonding in assembling the semiconductor device shown in FIG. 1. Further, FIG. 13 is a plan view showing an example of resin flowing directions during the injection of resin in a resin molding step in assembling the semiconductor device shown in FIG. 1, FIG. 14 is a partial sectional view showing a structural example in the interior of a cavity of a molding die during the injection of resin shown in FIG. 13, and FIG. 15 is a partial plan view showing an example of a positional relation between a resin injection gate of the molding die and a sensing wire during the injection of resin shown in FIG. 13.

First, a lead frame is provided in step S1 shown in FIG. 7. In this step, there is provided a lead frame 2 shown in FIG. 8, the lead frame 2 having a die pad 2c as a chip mounting area and plural inner leads 2a arranged around the die pad 2c. The lead frame 2 is a thin plate member formed of copper alloy for example.

The die pad 2c has a rectangular shape and is supported by suspending leads 2g centrally of its opposed short sides and is also supported by inner leads 2a at two positions of each of opposed long sides. That is, as inner leads 2a coupled integrally with the die pad 2c, the die pad 2c has four such inner leads 2a.

Thereafter, die bonding of step S2 in FIG. 7 is performed. In this step, as shown in FIG. 9, a semiconductor chip 3 is mounted onto the die pad 2c of the lead frame 2, the semiconductor chip 3 having a main surface 3a shown in FIG. 2 and plural electrode pads 3c at a peripheral edge portion of the main surface 3a. In this case, the semiconductor chip 3 is face-up-mounted onto the die pad 2c through a die bonding material 4 such as silver filler-containing paste resin.

Thereafter, wire bonding of step S3 in FIG. 7 is performed. The wire bonding is performed by a ball bonding method which forms a ball-like electrode 6g at the tip of a capillary 7 as a bonding tool and which performs ball bonding in this state, as shown in FIG. 10. According to the ball bonding method, plural electrode pads 3c of the semiconductor chip 3 and plural leads (inner leads 2a) corresponding to the electrode pads 3c are coupled together electrically through plural bonding wires 6. For example, the bonding wires 6 are gold wires.

First, there is performed first wire bonding of step S3-1 in FIG. 7. In this step, as the first wire bonding, thick first bonding wires 6a and third bonding wires 6c are first subjected to wire bonding, as shown in FIG. 11. After the first wire bonding is over, as second wire bonding of step S3-2, second bonding wires (sensing wires A) 6b, fourth bonding wires (sensing wires B) 6d and fifth bonding wires 6e, 6f, which are thinner than the first bonding wires 6a, are subjected to wire bonding, as shown in FIG. 12.

In the first wire bonding, as shown in FIG. 3, one end portion 6h of each first bonding wire 6a is coupled electrically to an electrode pad for GND (first electrode pad, first electrode pad for power supply) 3d out of the electrode pads 3c, while an opposite end portion 6i thereof is coupled electrically to a lead for GND (first lead, first power lead) 2d out of the inner leads 2a. The one end portion 6h of each first bonding wire 6a is a portion located on the ball-like electrode 6a side shown in FIG. 10. On the other hand, the opposite end portion 6i is a portion located on the side opposite to the ball-like electrode 6g. That is, the one end portion 6h of each first bonding wire 6a is on the side coupled to the associated electrode pad 3c of the semiconductor chip 3, while the opposite end portion 6i is on the side coupled to the associated inner lead 2a. Also for the third bonding wire 6c, wire bonding is performed like the first bonding wire 6a.

After the first wire bonding is over, the lead frame 2 is taken out (handling) and conveyed from the wire bonding apparatus concerned and is set to another wire bonding apparatus. Then, the second wire bonding is performed on the other wire bonding apparatus.

In the second wire bonding, as shown in FIG. 3, one end portion 6*j* of the second bonding wire (sensing wire A) 6*b* thinner than the first bonding wires 6*a* is coupled electrically to an electrode pad for GND monitor (second electrode pad, first electrode pad for monitor) 3*f* out of the electrode pads 3*c*, while an opposite end portion 6*k* of the second bonding wire 6*b* is coupled electrically to a lead for GND (first lead, first power lead) 2*d*. Like the first bonding wires 6*a*, one end portion 6*j* of the second bonding wire 6*b* is also a portion located on the ball-like electrode 6*g* side and the opposite end portion 6*k* is a portion located on the side opposite to the ball-like electrode 6*g*. That is, like the first bonding wires 6*a*, one end portion 6*j* of the second bonding wire 6*b* is also on the side coupled to the electrode pad 3*c* of the semiconductor chip 3 and the opposite end portion 6*k* is on the side coupled to the inner lead 2*a*. Also for the fourth bonding wire 6*d*, wire bonding is performed like the second bonding wire 6*b*.

In wire-bonding the second bonding wire 6*b*, as shown in FIG. 3, the opposite end portion 6*k* of the second bonding wire 6*b* is coupled electrically to the lead 2*d* for GND at a position more distant from the semiconductor chip 3 than the opposite end portions 6*i* of the first bonding wires 6*a*.

That is, when coupling plural bonding wires 6 to one and same inner lead 2*a*, a stitch position (a position of coupling to the lead) of a bonding wire 6 to be subjected to wire bonding later (in the second wire bonding step) is set at a position spaced away (more distant) from the tip of the inner lead with respect to a stitch position of the bonding wire 6 which was coupled first (in the first wire bonding step).

For example, in the case of first wire-bonding a thick first bonding wire 6*a* (in the first wire bonding step) and thereafter wire-bonding a thin second bonding wire 6*b* (in the second wire bonding step) to one and same inner lead 2*a* as in FIG. 3, a stitch position of the second bonding wire 6*b* is set at a position spaced away from the tip of the inner lead (a position more distant from the inner lead tip or an outward position in relation to the inner lead tip) with respect to the stitch position of the first bonding wire 6*a*.

In this way, displacement or deformation of the first bonding wire 6*a* which was first formed by wire bonding (in the first wire bonding step) can be prevented or diminished, which displacement or deformation occurs as a result of interference of the first bonding wire 6*a* with the operation of the capillary 7 at the time of wire-bonding the second bonding wire 6*a* which is performed later (in the second wiring step).

More specifically, in the case of the semiconductor package 1 of this first embodiment, as shown in FIG. 5, the position (stitch position) of coupling to the thin second bonding wire 6*b* (sensing wire A) in the lead for GND (first power lead) 2*d* is distant (more outward) from the outer periphery portion of the semiconductor chip 3 in comparison with the position (stitch position) of coupling to the thick first bonding wire 6*a* in the lead for GND 2*d*.

Further, the position (stitch position) of coupling to the thin fourth bonding wire 6*d* (sensing wire B) in the lead for power supply (second power lead) 2*e* is distant (more outward) from the chip-side tip of the lead for power supply 2*e* in comparison with the position (stitch position) of coupling to the thick third bonding wire 6*c* in the lead for power supply 2*e*.

By so doing it is possible to diminish or prevent displacement or deformation of the thin second bonding wire 6*b* or fourth bonding wire 6*d* which are subjected to wire bonding later (in the second wire bonding step).

In the case of wire-bonding bonding wires 6 of different thicknesses in the interior of one semiconductor device like assembling the semiconductor package 1 of this first embodiment, by first wire-bonding thick bonding wires 6 (first and third bonding wires 6*a*, 6*c*) and thereafter wire-bonding thin bonding wires 6 (second and fourth bonding wires 6*b*, 6*d*), it is possible to make deformation of the bonding wires 6 difficult to occur.

More particularly, when the thickness of the bonding wires 6 changes, the wire bonding apparatus used also changes, so there are performed conveyance of the lead frame 2 and handling by the operator at the time of change from one to another wire bonding apparatus. As a result, the bonding wires 6 which have been subjected to wire bonding in the initial wire bonding apparatus (in the first wire bonding step) are more likely to be deformed because there are performed conveyance and handling of the lead frame 2 for moving the lead frame to the second wire bonding step after wire bonding.

Therefore, by first coupling thick bonding wires 6 (in the first wire bonding step) and later coupling thin bonding wires 6 (in the second wire bonding step) it is possible to make deformation of all the bonding wires 6 difficult to occur.

Thus, according to the way of assembling the semiconductor package 1 of this first embodiment, it is possible to improve the reliability of the semiconductor package 1 by diminishing deformation of bonding wires 6 of different thicknesses coupled to one and same inner lead 2*a*.

After the wire bonding is over, there is performed resin molding of step S4 shown in FIG. 7. In this step, the semiconductor chip 3, the bonding wires 6 and a portion (inner leads 2*a*) of the leads are sealed with resin by resin molding to form the resinous sealing body 5 shown in FIG. 2.

In the resin molding step, first, as shown in FIG. 14, the lead frame 2 as a workpiece having been subjected to wire bonding is placed within a cavity 8*c* formed by an upper mold 8*a* and a lower mold 8*b* of the molding die 8 and in this state sealing resin 9 is charged into the cavity 8*c*.

As shown in FIG. 15, injection of the sealing resin 9 is performed at the position of the thin second bonding wire 6*b* more distant from a resin injection gate 8*d* of the molding die 8 than the position of the thick first bonding wires 6*a*. That is, with respect to the thick first bonding wires 6*a* and thin second bonding wire 6*b* all coupled to one and same inner lead 2*a*, the sealing resin 9 is injected at the position of the second bonding wire 6*b* more distant from the resin injection gate 8*d* than the first bonding wires 6*a*.

Consequently, during the injection of resin, the thin second bonding wire 6*b* deflects in a direction away from the first bonding wires 6*a* coupled to one and same inner lead 2*a*. That is, the thin bonding wire 6 is easier to deflect due to resistance of the sealing resin 9 in the injection of resin than the thick bonding wires 6, so that by disposing the thin bonding wire 6 (second bonding wire 6*b*) on the side distant from the resin injection gate 8*d* it is possible to diminish the occurrence of an electric short-circuit caused by wire deflection.

FIG. 13 shows resin deflecting directions during resin injection in the molding step of the semiconductor package 1. With respect to each set of a thin second bonding wire 6*b* and thick first bonding wires 6*a* all coupled to one and same inner lead 2*a*, the thin second bonding wire 6*b* is disposed on the advancing direction side of the associated resin deflecting direction 9*a* relative to the thick first bonding wires 6*a*. As a result, during the injection of resin, the thin second bonding wire 6*b* deflects in a direction away from the thick first bonding wires 6*a* due to a deflection resistance of the sealing resin 9, so that it is possible to diminish the occurrence of an electric short-circuit caused by wire deflection in the injection of resin.

Thus, since the occurrence of an electric short-circuit of the bonding wires 6 in assembling the semiconductor package 1 can be reduced, it is possible to improve the reliability of the semiconductor package 1.

In FIG. 13, the resin injection gate 8d is provided nearly centrally of one side of the package body and there are shown resin flowing directions 9a when sealing resin 9 is injected from near the central part of one side of the package body.

After the injection of the sealing resin 9 is over, the sealing resin 9 is cured to form a resinous sealing body 5.

After the resin molding is over, there are performed cutting and forming in step 5 shown in FIG. 7. In this step, in the lead frame 2 formed with the resinous sealing body 5, the outer leads 2b are cut at the respective end portions and are formed in a desired shape to complete assembly of the semiconductor package 1.

The following description is now provided about a modification of the first embodiment.

Figure 16:
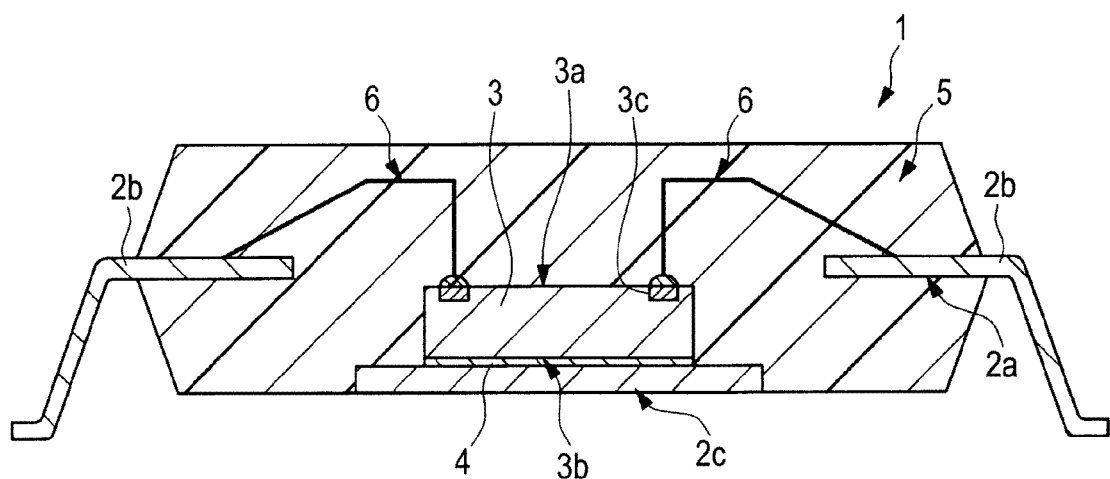
FIG. 16 is a partial sectional view showing the structure of a first modification of the semiconductor device of the first embodiment.
Figure 17:
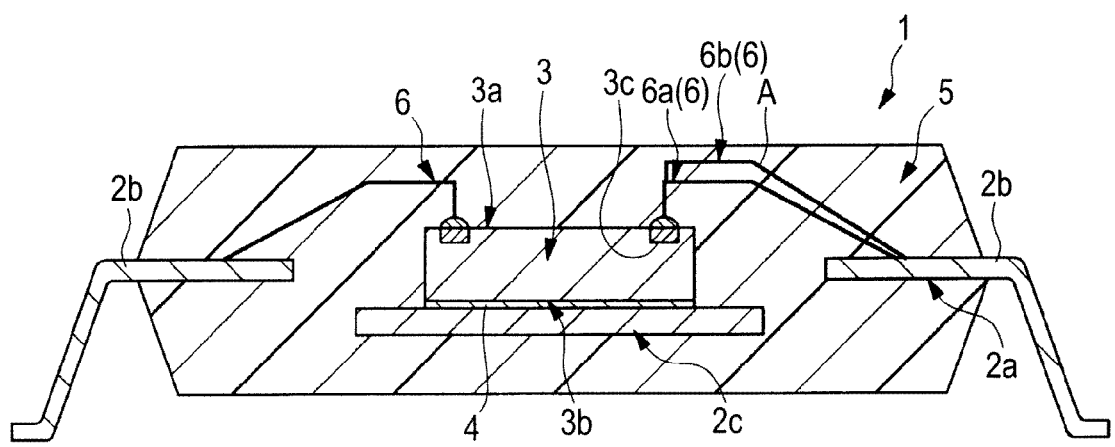
FIG. 17 is a partial sectional view showing the structure of a second modification of the semiconductor device of the first embodiment.
Figure 18:
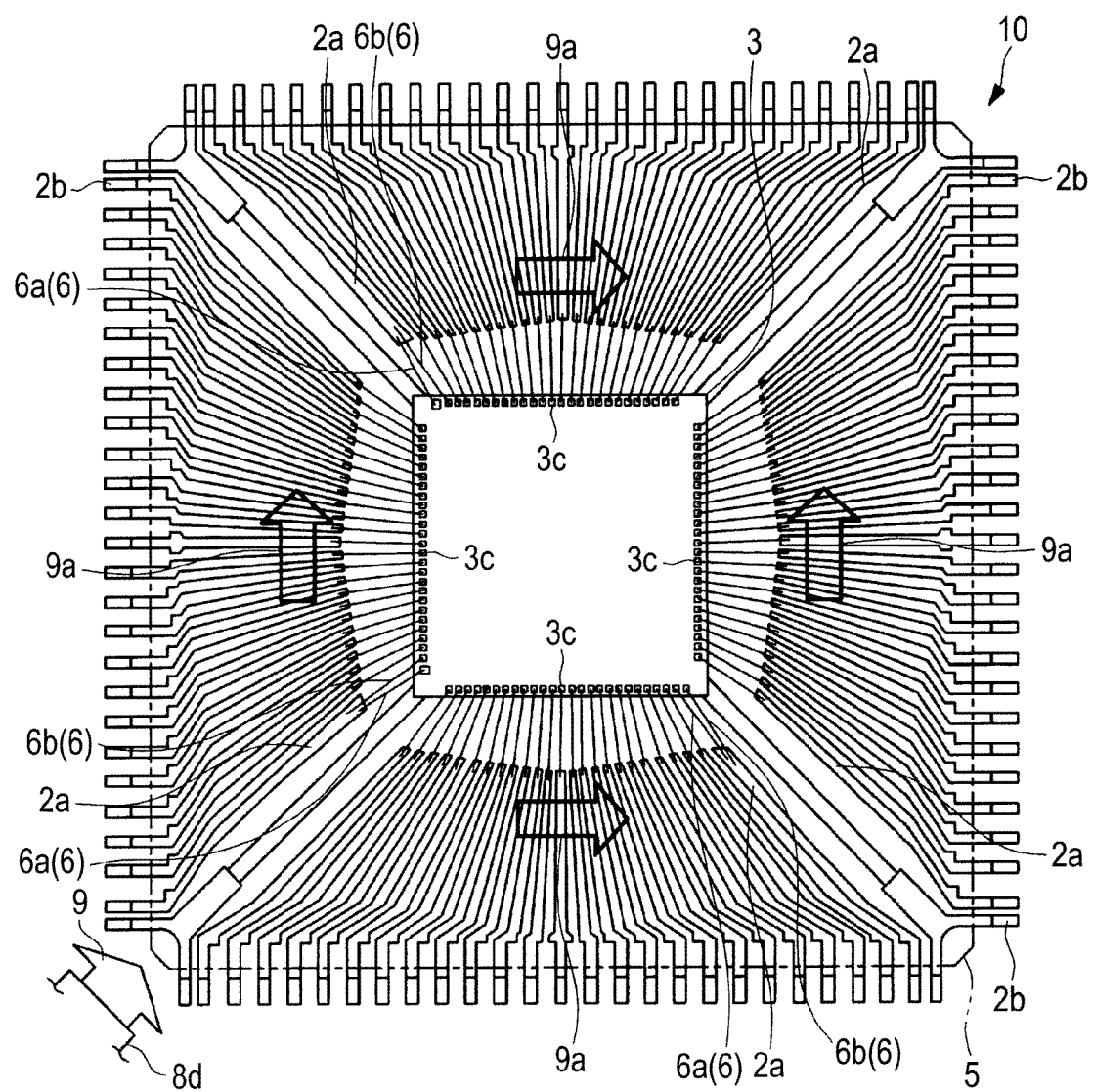
FIG. 18 is a plan view showing an example of resin flowing directions during the injection of resin in a resin molding step in a third modification of the semiconductor device of the first embodiment.

FIG. 16 is a partial sectional view showing the structure of a first modification of the semiconductor device of the first embodiment, FIG. 17 is a partial sectional view showing the structure of a second modification of the semiconductor device of the first embodiment, and FIG. 18 is a plan view showing an example of resin flowing directions in a resin molding step according to a third modification of the semiconductor device of the first embodiment.

The first modification shown in FIG. 16 is of a structure in which the surface (back surface) on the side opposite to the chip mounting side of the die pad 2c is exposed from the lower surface of the resinous sealing body 5, whereby it is possible to enhance the heat dissipating property of the semiconductor package 1. Therefore, when the quantity of heat generated from the semiconductor chip 3 incorporated in the semiconductor package 1 is large, it is possible to further improve the reliability of the semiconductor package 1.

Next, according to the second modification shown in FIG. 17, with respect to thick first bonding wires 6a and a thin second bonding wire (sensing wire A) all coupled to one and same inner lead 2a, a loop height of the second bonding wire 6b is made larger than that of each first bonding wire 6a.

That is, the loop height of the thin bonding wire 6b is set larger than that of each thick bonding wire 6. By so doing, the bonding wire 6 of the larger loop height can be made easier to deflect than the bonding wire 6 of the small loop height against the resin flow in the resin molding step. As a result, the thin second bonding wire (sensing wire A) 6b deflects in a direction away from the thick first bonding wires 6a and hence it is possible to diminish the occurrence of an electrical short-circuit caused by wire deflection in the injection of resin.

Thus, the loop height is made different between the thin and thick bonding wires 6, but this is also true of the thin fourth bonding wire (sensing wire B) 6d and thick third bonding wire 6c shown in FIG. 5. By making the loop height of the fourth bonding wire 6d larger than that of the third bonding wire 6c it is possible to diminish the occurrence of an electric short-circuit caused by wire deflection in the injection of resin.

Next, the third modification shown in FIG. 18 shows resin flowing directions 9a in the resin molding step in the case of the semiconductor device being a QFP (Quad Flat Package) 10. Because of QFP 10, the resin injection gate 8d for the injection of resin is disposed on a diagonal line of the package body. Also in this case, in the thin second bonding wire 6b and thick first bonding wire 6a both coupled to one and same inner lead 2a, the thin second bonding wire 6b is positioned on the advancing direction side of the associated resin flowing direction 9a with respect to the thick first bonding wire 6a. By so doing, at the time of resin injection, the thin second bonding wire 6b deflects in a direction away from the thick first bonding wire 6a due to a flowing resistance of the sealing resin 9, so that it is possible to diminish the occurrence of an electric short-circuit caused by wire deflection in rein injection.

Second Embodiment

Figures 19, 20:
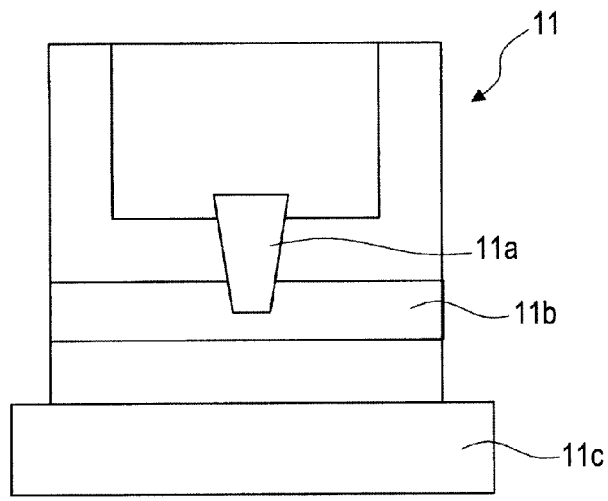
FIG. 19 is a front view showing a structural example of a wire bonder used in a wire bonding step in assembling a semiconductor device according to a second embodiment of the present invention.
FIG. 20 is a measured value data diagram showing an example of various times in a reference tact for deriving wire bonding conditions used in the wire bonding step in assembling the semiconductor device of the second embodiment.

FIG. 19 is a front view showing a structural example of a wire bonder used in a wire bonding step in assembling a semiconductor device according to a second embodiment of the present invention and FIG. 20 is a measured value data diagram showing an example of various times in a reference tact for deriving wire bonding conditions used in the wire bonding step in assembling the semiconductor device of the second embodiment. Further, FIG. 21 is a calculated value data diagram showing an example of tact calculation for deriving wire bonding conditions used in the wire bonding step in assembling the semiconductor device of the second embodiment and FIG. 22 is a calculated value data diagram showing an example of tact calculation taking into account a tact-down rate for deriving wire bonding conditions used in the wire bonding step in assembling the semiconductor device of the second embodiment.

This second embodiment relates to a wire bonding step in assembling the semiconductor device having plural different kinds of wires (in the first embodiment two kinds of wires different in thickness) (hereinafter referred to also as "multiwiring") like the semiconductor package 1 described in the first embodiment.

For example, the type of a multiwired semiconductor device to be manufactured is taken into account in the design of patterns as a multiwired package (wire selection in the package and selection of thick and thin wires), but when using the multiwiring type as a line of wire bonder group, the tact in assembly is certain to be deteriorated in comparison with a single wire type.

In view of this point, according to this second embodiment, in performing wire bonding of a multiwired semiconductor device, a tact calculation formula (bonding conditions calculating means) for suppressing the tact-down rate is derived and wire bonding is performed under the wire bonding conditions thus derived using the tact calculation formula.

FIG. 19 shows a wire bonder (wire bonding apparatus) 11 used in this second embodiment. The wire bonder 11 is comprised of a bonding head 11a provided with a bonding tool such as the capillary 7 shown in FIG. 10, a main conveyance rail 11c for receiving and delivering a lead frame 2 (see FIG. 8) as a workpiece having been subjected to die bonding, and a feeder 11b which guides the lead frame 2 within the apparatus.

In this second embodiment, a description will be given with reference as an example to a case where both thick wire (first bonding wire 6a) and thin wire (second bonding wire 6b) as in the semiconductor package 1 described in the first embodiment are subjected to wire bonding.

FIG. 20 shows reference values (measurement of processing times using a single type) for finding out a calculation formula (bonding conditions calculating means) corresponding to a multiwired package. In FIG. 20, the feed time is the time required from when the lead frame 2 is received within the feeder 11b until conveyance is performed up to a bonding point, the recognition time is the time for positional correction prior to bonding, and the bonding time is a processing time of wire bonding.

FIG. 21 shows the results of having calculated values of tact and tact-down rate by utilizing the calculation formula derived in this second embodiment and at the number of wires in a first group (thick wire group) and that of wires in a second group (thin wire group) which numbers are designated to be present numbers without taking suppression of the tact-down rate into account. Further, FIG. 22 shows the results of having derived optimum numbers of wire bonders and first and second group wires.

In FIG. 20, a stands for a wire bonding time (sec.), b stands for a heat-up wait time (sec.) of one frame, c stands for a feed time (sec.) of one frame, d stands for a recognition time (sec.) processed in one frame, N stands for the number of frames processed in one cycle (60 frames as a least common multiple of the number of wire bonder), and T stands for the number of frames (60 frames) in one cycle, the times a to d being measured values.

In FIGS. 21 and 22, A stands for the number of wires in the first group (thick wire group), B stands for the number of wires in the second group (thin wire group), X stands for the number of wire bonder in the first group (thick wire group), Y stands for the number of wire bonder in the second group (thin wire group), C stands for the number of chips in one frame, T1 stands for tact (sec.) based on the tact calculation formula derived this time, and D stands for a tact-down rate (%) derived by comparison between the reference tact T and the tact of T1.

In multiwiring, the total number of wire bonders in one line is X+Y. When the number-of-wire bonder ratio is equal to the number-of-wire ratio, there is obtained a well-balanced way of deflection (a way of deflection which suppresses the tact-down rate).

That is, there exists a relationship (first calculation formula) of A/B=X/Y (A, B, X, Y are integers).

At certain ratios of the number of wire bonder and that of wires in the first group (thick wire group) and second group (thin wire group), there occurs a bonding end wait time in the first or the second group and hence a common tact calculation formula is improper. For this reason, a tact calculation formula was here derived using the number of wire bonder in the second group.

A tact calculation formula and a tact-down rate both derived in this second embodiment will be described below.

First, if the first group wires processing time is assumed to be t1, t1=b+c+d+(a×A×C), and if the second group wires processing time is assumed to be t2, t2=b+c+d+(a×B×C).

In connection with the tact calculation formula, a tact is basically determined by a longer wire processing time in the first or the second group, so that when the number of second group wire bonders is three or four, the tact becomes T1=t2×(N/Y) (second calculation formula), which depends on the second group wire processing time.

When the number of second group wire bonders is five, T=t1×N (third calculation formula), which depends on the first group wire processing time.

If a tact-down rate is determined from the reference tact T and the tact derived from the above tact calculation formula, it is calculated in terms of the following calculation formula, D=100−(T/T1)×100(%) (fourth calculation formula).

FIG. 21 shows a concrete example of having determined tact and tact-down rate with use of the second, third and fourth calculation formulae and FIG. 22 shows a concrete example of having determined tact and tact-down rate with use of the first, second, third and fourth calculation formulae.

In FIG. 21, a tact T1 (sec.) and a tact-down rate D (%) were determined on the basis of the numbers of first and second group wire bonders, assuming that the number of frames in one cycle is 60 and at the numbers of first and second group wires (first group: 16 pc., second group: 47 pc.) presently designated without taking suppression of the tact-down rate into account.

In the case of this tact, there occurs a bonding wait time and a well-balanced deflection is not obtained, thus resulting in deterioration of the tact-down rate.

To solve this problem, as shown in FIG. 22, the numbers of wires for the numbers of wire bonders in the first and second groups were determined using the foregoing first calculation formula and tact calculation was performed using the thus-determined numbers of wires to determine a tact-down rate.

From FIGS. 21 and 22 it is seen that the tact-down rate can be kept low by combining A and B so as to approach A/B=X/Y.

According to this second embodiment, in assembling a multiwired package, the tact and tact-down rate can be calculated automatically by only inputting the number of wires in the first group (thick wires) and that in the second group (thin wires). Further, the tact time can be determined in terms of a calculation formula for plural wire bonders 11.

Moreover, by calculating a tact time in accordance with the tact calculation formula it is possible to derive an optimum ratio in the number of wires in the thick wire group and that in the thin wire group.

Further, by calculating a tact time with use of the tact calculation formula it is possible to derive an optimum number of wire bonders 11.

In this way it is possible to suppress the tact-down rate in wire bonding.

That is, in assembling the semiconductor package 1 (semiconductor device) having bonding wires 6 of different diameters (plural thicknesses), it is possible to derive wire bonding conditions with a suppressed tact-down rate.

More particularly, in assembling the semiconductor device having wires different in thickness, an optimum ratio in the number of bonding wires 6 for each type (thickness) and an optimum number of wire bonders 11 for each type (thickness) can be derived using a tact calculation formula (bonding conditions calculating means) for calculating a distribution of the number of bonding wires according to the thickness (type) of the bonding wires 6 and for calculating a required number of wire bonders 11 according to the thickness (type) of the bonding wires 6.

Further, by performing wire bonding under the conditions derived by the above tact calculation formula, the wire bonding can be done while keeping the tact-down rate low also when coupling plural bonding wires 6 of different diameters (thicknesses) to one and same inner lead 2a out of plural inner leads 2a.

Although the present invention has been described above by way of embodiments thereof, it goes without saying that the present invention is not limited to the above embodiments and that various changes maybe made within the scope not departing from the gist of the invention.

For example, although the bonding wires (first to fifth bonding wires) 6 used in the first and second embodiments are gold wires, they may be copper wires.

Copper wires are harder than gold wires, so in the case of performing wire bonding twice (in two steps) separately between thick wires and thin wires as in assembling the semiconductor package 1 of the first embodiment, it is possible to diminish the occurrence of displacement or positional deviation of the wires coupled in the first step caused by a bad influence thereon of bonding vibration in the latter bonding step.

Moreover, since copper wires are less expensive than gold wires, it is possible to attain a further reduction in cost of the semiconductor package 1.

Further, although in the above embodiments reference has been made to the SOP type semiconductor device as an example, the semiconductor device is not limited to the SOP type. The present invention is applicable also to other semiconductor devices, e.g., SOJ (Small Outline J-leaded Package), QFP and QFN (Quad Flat Non-leaded Package), as long as they are of the type assembled using the lead frame 2 and in which plural wires of different types (thicknesses) are wire-bonded to one and same inner lead 2*a*.

The present invention is suitable for an electronic device wherein wires different in thickness are coupled electrically to one and same lead.

What is claimed is:

1. A semiconductor device comprising:
    a semiconductor chip having a plurality of electrode pads;
    a plurality of leads arranged around the semiconductor chip;
    a plurality of bonding wires for coupling the electrode pads and the leads electrically with each other; and
    a resinous sealing body for sealing the semiconductor chip, the bonding wires and a portion of the leads,
    wherein the leads include a first power lead for supplying a first operating potential to the semiconductor chip,
    wherein the electrode pads include: a first power supply electrode pad coupled electrically to the first power lead through a first bonding wire; and a first monitor electrode pad coupled electrically to the power lead through a second bonding wire to monitor the potential of the first power lead, and
    wherein the second bonding wire is thinner than the first bonding wire.

2. The semiconductor device according to claim 1, wherein the first and second bonding wires are gold wires.

3. The semiconductor device according to claim 1, wherein the first and second bonding wires are copper wires.

4. The semiconductor device according to claim 1,
    wherein the leads include a second power lead for supplying a second operating potential higher than the first operating potential to the semiconductor chip,
    wherein the electrode pads include a second power supply electrode pad coupled electrically to the second power lead through a third bonding wire and a second monitor electrode pad coupled electrically to the second power lead through a fourth bonding wire to monitor the potential of the second power lead, and
    wherein the fourth bonding wire is thinner than the third bonding wire.

5. The semiconductor device according to claim 4, wherein the first operating potential is a ground potential and the second operating potential is a power supply potential.

6. The semiconductor device according to claim 4,
    wherein the semiconductor chip includes an output circuit for outputting an electric current to drive an external device as a load and a control circuit for controlling the electric current outputted from the output circuit,
    wherein the electrode pads include an output signal pad used as an output terminal of the output circuit, and
    wherein the output circuit is operated with the first and second potentials supplied from the first and second power supply electrode pads.

7. The semiconductor device according to claim 6, wherein the control circuit controls the output of the output circuit in accordance with predetermined signals provided from the first and second monitor electrode pads.

8. The semiconductor device according to claim 7, wherein the leads include an output lead coupled electrically to the output signal pad through a fifth bonding wire.

9. The semiconductor device according to claim 1, wherein the semiconductor chip is mounted over a chip mounting area formed of the same material as the leads, and the first power lead is formed continuously and integrally with the chip mounting area.

10. The semiconductor device according to claim 1,
    wherein the resinous sealing body is formed by a transfer molding method using a molding die having a resin injection gate, and
    wherein the second bonding wire is disposed at a position more distant from the resin injection gate than the position of the first bonding wire.

11. The semiconductor device according to claim 1, wherein the position of coupling of the first power lead to the second bonding wire is distant from a chip-side tip of the first power lead or from an outer periphery portion of the semiconductor chip in comparison with the position of coupling of the first power lead to the first bonding wire.

12. The semiconductor device according to claim 11, wherein a loop height of the second bonding wire is larger than that of the first bonding wire.

13. The semiconductor device according to claim 4, wherein the position of coupling of the second power lead to the fourth bonding wire is distant from a chip-side tip of the second power lead or from an outer periphery portion of the semiconductor chip.

14. The semiconductor device according to claim 13, wherein a loop height of the fourth bonding wire is larger than that of the third bonding wire.

* * * * *